United States Patent
Yamanaka et al.

(10) Patent No.: US 10,895,783 B2
(45) Date of Patent: Jan. 19, 2021

(54) METHOD FOR MANUFACTURING A MULTILAYER FILM COMPRISING A STEP OF DIRECTLY APPLYING A LIQUID CRYSTAL COMPOSITION CONTAINING A POLYMERIZABLE LIQUID CRYSTAL COMPOUND ONTO A SURFACE OF A FED-OUT FIRST SUBSTRATE

(71) Applicant: ZEON CORPORATION, Tokyo (JP)

(72) Inventors: Shunsuke Yamanaka, Tokyo (JP); Masakazu Saito, Tokyo (JP); Hiromasa Hashimoto, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 16/274,915

(22) Filed: Feb. 13, 2019

(65) Prior Publication Data
US 2019/0187351 A1 Jun. 20, 2019

Related U.S. Application Data

(62) Division of application No. 15/030,681, filed as application No. PCT/JP2014/078646 on Oct. 28, 2014, now abandoned.

(30) Foreign Application Priority Data

Oct. 28, 2013 (JP) .................... 2013-223699
Aug. 29, 2014 (JP) .................... 2014-175917

(51) Int. Cl.
*G02F 1/13363* (2006.01)
*G02B 5/30* (2006.01)

(52) U.S. Cl.
CPC .......... *G02F 1/13363* (2013.01); *G02B 5/30* (2013.01); *G02B 5/3016* (2013.01); *G02B 5/3083* (2013.01)

(58) Field of Classification Search
CPC ...... B32B 23/20; B32B 2307/42; B32B 23/08; B32B 2457/206; G02B 5/3041; G02B 5/3016; G02F 1/13363
See application file for complete search history.

(56) References Cited

U.S. PATENT DOCUMENTS

| | | | |
|---|---|---|---|
| 5,132,147 A | 7/1992 | Takiguchi et al. | |
| 5,833,880 A | 11/1998 | Siemensmeyer et al. | |

(Continued)

FOREIGN PATENT DOCUMENTS

| | | |
|---|---|---|
| CN | 1447928 A | 10/2003 |
| CN | 1886681 A | 12/2006 |

(Continued)

OTHER PUBLICATIONS

Jan. 20, 2015 Search Report issued in International Patent Application No. PCT/JP2014/078646.

(Continued)

*Primary Examiner* — Paul C Lee
(74) *Attorney, Agent, or Firm* — Oliff PLC

(57) ABSTRACT

A multilayer film including: a first long-length substrate; and an optically anisotropic layer that is formed directly on the first substrate and contains cured liquid-crystal molecules, wherein the first substrate has an orientation-controlling force caused by stretching, and a slow axis of the first substrate is different from a lengthwise direction of the first substrate; an optically anisotropic laminate, a circular polarizing plate, and an organic EL display device having the anisotropic layer; as well as manufacturing method thereof.

15 Claims, 2 Drawing Sheets

(56) References Cited

U.S. PATENT DOCUMENTS

| | | |
|---|---|---|
| 6,215,539 B1 | 4/2001 | Schadt et al. |
| 6,300,991 B1 | 10/2001 | Schadt et al. |
| 6,699,405 B2 | 3/2004 | Prechtl et al. |
| 6,793,986 B2 | 9/2004 | Prechtl et al. |
| 7,411,645 B2 | 8/2008 | Kashima |
| 7,754,912 B2 | 7/2010 | Irisawa et al. |
| 7,771,616 B2 | 8/2010 | Irisawa et al. |
| 9,207,360 B2 | 12/2015 | Sakamoto et al. |
| 2003/0164921 A1 | 9/2003 | Uesaka et al. |
| 2004/0189909 A1 | 9/2004 | Kashima |
| 2006/0001799 A1* | 1/2006 | Kawamoto ......... G02B 5/3016 349/96 |
| 2006/0013968 A1 | 1/2006 | Kuo et al. |
| 2007/0114491 A1 | 5/2007 | Shi et al. |
| 2007/0139773 A1 | 6/2007 | Kawamoto et al. |
| 2007/0176145 A1* | 8/2007 | Nishikawa ............ C09K 19/18 252/299.01 |
| 2008/0180619 A1 | 7/2008 | Kashima |
| 2009/0078371 A1* | 3/2009 | Shimizu ............... C09J 133/066 156/701 |
| 2009/0226641 A1* | 9/2009 | Nakamura ............. B29C 55/08 428/1.33 |
| 2009/0279031 A1* | 11/2009 | Kitagawa ............. G02B 5/3083 349/118 |
| 2010/0225854 A1* | 9/2010 | Kawamoto ......... G02B 5/3083 349/96 |
| 2012/0058321 A1* | 3/2012 | Goto .................... B29C 55/026 428/213 |
| 2013/0114136 A1 | 5/2013 | Saito et al. |
| 2016/0145363 A1 | 5/2016 | Sakamoto et al. |

FOREIGN PATENT DOCUMENTS

| | | |
|---|---|---|
| CN | 1950350 A | 4/2007 |
| EP | 1508823 A1 | 2/2005 |
| JP | H03-9325 A | 1/1991 |
| JP | H04-16919 A | 1/1992 |
| JP | H08-50206 A | 2/1996 |
| JP | H08-160430 A | 6/1996 |
| JP | 11-52131 A | 2/1999 |
| JP | H11-153712 A | 6/1999 |
| JP | 2980558 B2 | 11/1999 |
| JP | H11-513360 A | 11/1999 |
| JP | 2000-267105 A | 9/2000 |
| JP | 2002-006322 A | 1/2002 |
| JP | 2002-030042 A | 1/2002 |
| JP | 2002-321302 A | 11/2002 |
| JP | 2003-177242 A | 6/2003 |
| JP | 2003-207641 A | 7/2003 |
| JP | 2004-204190 A | 7/2004 |
| JP | 2005-263789 A | 9/2005 |
| JP | 2005-289980 A | 10/2005 |
| JP | 2006-030931 A | 2/2006 |
| JP | 2006-178389 A | 7/2006 |
| JP | 2007-119415 A | 5/2007 |
| JP | 2007-186430 A | 7/2007 |
| JP | 2008-058868 A | 3/2008 |
| JP | 2010-084032 A | 4/2010 |
| TW | 200517688 A | 6/2005 |
| TW | 200602772 A | 1/2006 |
| WO | 2005/026830 A1 | 3/2005 |
| WO | 2010/074166 A1 | 7/2010 |
| WO | 2012/070808 A2 | 5/2012 |
| WO | 2012/147904 A1 | 11/2012 |

OTHER PUBLICATIONS

Jan. 20, 2015 Written Opinion issued in International Patent Application No. PCT/JP2014/078646.

Jill Journal of Technical Disclosure No. 2001-1745, Mar. 15, 2001, pp. 1-84.

C. Destrade et al. "Disc-Like Mesogens: A Classification". Molecular Crystals and Liquid Crystals, 1981, vol. 71, pp. 111-135.

"Chemistry of Liquid Crystal". The Chemical Society of Japan, Kikan Kagaku Sosetsu, May 1994, No. 22, Chaper 5 and Chapter 10, Section 2.

J. Zhang et al. "Liquid Crystals Based on Shape-Persistent Macrocyclic Mesogens". J. Am. Chem. Soc., 1994, vol. 116, pp. 2655.

Jun. 6, 2017 Search Report issued in European Patent Application No. 14857170.6.

Apr. 18, 2018 Office Action issued in Taiwanese Patent Application No. 103137154.

\* cited by examiner

METHOD FOR MANUFACTURING A MULTILAYER FILM COMPRISING A STEP OF DIRECTLY APPLYING A LIQUID CRYSTAL COMPOSITION CONTAINING A POLYMERIZABLE LIQUID CRYSTAL COMPOUND ONTO A SURFACE OF A FED-OUT FIRST SUBSTRATE

CROSS-REFERENCE TO RELATED APPLICATION

The present application is a divisional application of U.S. application Ser. No. 15/030,681 filed Apr. 20, 2016, which in turn is a U.S. national stage application of PCT/JP2014/078646 filed Oct. 28, 2014. The entire disclosure of each of these prior applications is incorporated herein by reference in its entirety.

FIELD

The present invention relates to a multilayer film that has an optically anisotropic layer and an optically anisotropic laminate. The present invention also relates to a circular polarizing plate having the optically anisotropic layer, an organic electroluminescent display device, and a manufacturing method.

BACKGROUND

A phase difference plate is widely used as a component of display devices such as a liquid crystal display device and an organic electroluminescent (hereinafter sometimes referred to as "organic EL") display device. A phase difference plate used in the display device may be required to uniformly express a desired phase difference of $\lambda/4$, $\lambda/2$, or the like in the entire wavelength region for displaying (usually visible region), to thereby expressing the effect in the entire wavelength region for displaying.

If it is possible to continuously manufacture such a phase difference plate as a long-length film having a desired width in a manufacture line, from which phase difference plates of a rectangular shape that corresponds to a rectangular display surface of the display device are then cut out, this process would enable efficient manufacturing. Further, if it is possible to perform such cutting such that the edges of the rectangular shape correspond to directions close to directions parallel to the lengthwise direction and widthwise direction of the long-length phase difference plate, this process would enables more efficient manufacturing.

The phase difference plate in the display device may be required to have a slow axis at a certain angle, such as 15°, 45°, or 75°, relative to a transmission axis of a co-used polarizing plate. For example, when a linear polarizer and a $\lambda/4$ wave plate are used in combination to express an anti-reflection function, the phase difference plate is required to have a slow axis at an angle of 45° relative to a transmission axis of the linear polarizer. Regarding polarization axes of a polarizing plate, a transmission axis of the polarizing plate in many cases is in a direction parallel to a widthwise or lengthwise side of a rectangular display surface of the display device. In manufacturing of a linear polarizer as a long-length film, a linear polarizer having a transmission axis in a direction parallel to or orthogonal to the lengthwise direction, particularly in a direction orthogonal to the lengthwise direction, can be easily manufactured. Therefore, if it is possible to manufacture a long-length phase difference plate having a slow axis at a certain angle such as 15°, 45°, or 75° relative to the widthwise direction, such a manufacturing process is very advantageous for manufacturing the phase difference plates for the display device.

As one of methods for obtaining the phase difference plate, there is known a method of using a compound capable of exhibiting a liquid crystal phase in which such a compound is molded into a solid film while keeping the state of the liquid crystal phase. Specific examples of the method may include a method in which a composition containing a polymerizable liquid crystal compound that is polymerizable and capable of exhibiting a liquid crystal phase is applied onto a surface of an appropriate substrate to form a layer, and orientation is given to the polymerizable compound in the layer and then polymerized while keeping the oriented state, to thereby form an optically anisotropic film. According to such a method, a phase difference plate that uniformly expresses phase difference in the plane can be obtained. When the polymerizable liquid crystal compound is appropriately selected, a phase difference plate that causes a uniform phase difference at a visible light wavelength region can be obtained (for example, Patent Literature 1).

As a method for giving orientation to such a compound capable of exhibiting a liquid crystal phase, a method in which an orientation-controlling force is imparted to a surface of a substrate, a composition containing a compound capable of exhibiting a liquid crystal phase is then applied onto the surface and placed under conditions suitable for giving orientation is usually performed. Examples of the method for imparting an orientation-controlling force to a surface of a substrate may include a method through rubbing (for example, Patent Literatures 2 to 4) and a method of optical orientation (for example, Patent Literatures 5 and 6). In addition, a method in which a film that has been subjected to a stretching treatment is used as a substrate to give orientation to a liquid crystal compound on a film is known (for example, Patent Literatures 7 to 9).

CITATION LIST

Patent Literature

Patent Literature 1: Japanese Patent Application Laid-Open No. Hei. 11-52131 A
Patent Literature 2: Japanese Patent Application Laid-Open No. Hei. 8-160430 A
Patent Literature 3: Japanese Patent Application Laid-Open No. 2000-267105 A
Patent Literature 4: Japanese Patent Application Laid-Open No. 2002-6322 A
Patent Literature 5: Japanese Patent No. 2980558 B
Patent Literature 6: Japanese Patent Application Laid-Open No. Hei. 11-153712 A
Patent Literature 7: Japanese Patent Application Laid-Open No. Hei. 3-9325 A
Patent Literature 8: Japanese Patent Application Laid-Open No. Hei. 4-16919 A
Patent Literature 9: Japanese Patent Application Laid-Open No. 2003-207641 A

SUMMARY

Technical Problem

However, operation of rubbing may easily generate static electricity during the treatment process. Such generation of static electricity causes problems such as attachment of a heterogeneous matter. Further, quality of the product is deteriorated due to occurrence of orientation defects. Further, when the rubbing is continuously performed in a diagonal direction on a long-length substrate, there is a problem in which it is very difficult to exactly control the orientation direction. Further, when the orientation-controlling force is imparted by optical orientation, there are problems of high cost and low processing rate.

Therefore, an object of the present invention is to provide a multilayer film and an optically anisotropic laminate that have an optically anisotropic layer, that can be used for a material for a phase difference plate such as a λ/2 wave plate and a λ/4 wave plate, that uniformly expresses phase difference in the plane, that can be efficiently manufactured, and that has a reduced number of defects due to generation of a heterogeneous matter, and a method for manufacturing the same.

Another object of the present invention is to provide a circular polarizing plate and an organic electroluminescent display device that can be efficiently manufactured and that have a reduced number of defects due to generation of a heterogeneous matter.

Solution to Problem

The present inventor has studied to solve the aforementioned problems. As a result, the inventor has conceived of use of a substrate having a slow axis in a direction that is different from the lengthwise direction thereof. The inventor has found out that, when an optically anisotropic layer containing cured liquid-crystal molecules with orientation regularity is formed directly on such a substrate, the aforementioned problems can be solved. Thus, the present invention has been completed.

Accordingly, the present invention provides the following.

(1) A multilayer film comprising:
a first long-length substrate; and
an optically anisotropic layer that is formed directly on the first substrate and contains cured liquid-crystal molecules, wherein
the first substrate has an orientation-controlling force caused by stretching, and
a slow axis of the first substrate is different from a lengthwise direction of the first substrate.

(2) The multilayer film according to (1), wherein the slow axis of the first substrate and the lengthwise direction of the first substrate form an angle of 10° to 90°.

(3) The multilayer film according to (2), wherein the slow axis of the first substrate and the lengthwise direction of the first substrate form an angle of 40° to 50°.

(4) The multilayer film according to any one of (1) to (3), wherein the first substrate is a film of a resin having a positive intrinsic birefringence.

(5) The multilayer film according to any one of (1) to (4), wherein the first substrate is a film of a resin containing an alicyclic structure-containing polymer or a film of cellulose ester.

(6) The multilayer film according to any one of (1) to (5), wherein the first substrate is a stretched film obtained by widthwise stretching or diagonal stretching.

(7) The multilayer film according to any one of (1) to (6), wherein the optically anisotropic layer has inverse wavelength distribution.

(8) The multilayer film according to any one of (1) to (7), wherein the optically anisotropic layer is a λ/4 wave plate.

(9) The multilayer film according to any one of (1) to (7), wherein the optically anisotropic layer is a λ/2 wave plate.

(10) The multilayer film according to any one of (1) to (9), wherein the optically anisotropic layer has a thickness of 5 μm or less.

(11) The multilayer film according to any one of (1) to (10), wherein the cured liquid-crystal molecules of the optically anisotropic layer have homogeneous orientation regularity in substantially a same direction as a direction of the slow axis of the first substrate.

(12) The multilayer film according to any one of (1) to (11), wherein the optically anisotropic layer formed on the first substrate is obtained by
applying onto the first substrate a liquid crystal composition containing a polymerizable liquid crystal compound to form a layer of the liquid crystal composition,
giving homogeneous orientation to the polymerizable liquid crystal composition in the layer, the orientation being in substantially a same direction as a direction of the slow axis of the first substrate, and
polymerizing the polymerizable liquid crystal compound to form the cured liquid-crystal molecules.

(13) The multilayer film according to any one of (1) to (12), wherein the first substrate has a birefringence Δn of 0.000050 or more.

(14) An optically anisotropic laminate obtained by separating the optically anisotropic layer from the multilayer film according to any one of (1) to (13) and
attaching the optically anisotropic layer to a second long-length substrate.

(15) A circular polarizing plate obtained by attaching an optically anisotropic layer to a long-length linear polarizer by a roll-to-roll process, wherein
the optically anisotropic layer is a layer separated from the multilayer film according to any one of (1) to (13).

(16) An organic electroluminescent display device comprising the circular polarizing plate according to (15).

(17) A method for manufacturing the multilayer film according to any one of (1) to (13), comprising:
a step (I) of feeding out a long-length first substrate in the lengthwise direction, the first substrate having an orientation-controlling force caused by stretching, wherein a slow axis of the first substrate is different from a lengthwise direction of the first substrate;
a step (II) of directly applying onto a surface of the fed-out first substrate a liquid crystal composition containing a polymerizable liquid crystal compound to form a layer of the liquid crystal composition;
a step (III) of giving orientation to the polymerizable liquid crystal compound in the layer of the liquid crystal composition; and
a step (IV) of polymerizing the polymerizable liquid crystal compound to form cured liquid-crystal molecules.

(18) The method for manufacturing the multilayer film according to (17), wherein an applying direction of the liquid crystal composition is different from an orientation direction of the polymerizable liquid crystal compound.

Further, the present application discloses the following.

(19) A resin film formed on a long-length substrate, the film comprising a cured liquid-crystal molecule, wherein:
the substrate has a slow axis in a direction different from the widthwise direction thereof; and
the cured liquid-crystal molecule has homogeneous orientation regularity in substantially the same direction as the slow axis direction of the substrate.

(20) The resin film according to (19), wherein:
the forming of the resin film on the substrate comprises:
applying onto the substrate a liquid crystal composition containing a polymerizable liquid crystal compound to form a layer of the liquid crystal composition;
giving homogeneous orientation to the polymerizable liquid crystal compound in the layer, the orientation being in substantially the same direction as the direction of slow axis of the substrate, and
polymerizing the polymerizable liquid crystal compound to form the cured liquid-crystal molecule.

(21) The resin film according to (19) or (20), wherein the substrate has a birefringence $\Delta n$ of 0.000050 or more.

(22) The resin film according to any one of (19) to (21) having inverse wavelength distribution.

(23) The resin film according to any one of (19) to (22), wherein the substrate is a film of a resin containing an alicyclic structure-containing polymer or a film of cellulose ester.

(24) A $\lambda/4$ wave plate comprising the resin film according to any one of (19) to (23).

(25) The $\lambda/4$ wave plate according to (24) further comprising the substrate.

(26) A circular polarizing plate comprising the $\lambda/4$ wave plate according to (24) or (25).

(27) An organic electroluminescent display device comprising the circular polarizing plate according to (26).

(28) A method for manufacturing a resin film containing a cured liquid-crystal molecule, the method comprising:
applying onto a substrate a liquid crystal composition containing a polymerizable liquid crystal compound to form a layer of the liquid crystal composition;
giving homogeneous orientation to the polymerizable liquid crystal compound in the layer, the orientation being in substantially the same direction as the direction of slow axis of the substrate; and
a step of polymerizing the polymerizable liquid crystal compound to form the cured liquid-crystal molecule, wherein:
the substrate is a long-length substrate, and has a slow axis in a direction different from the widthwise direction thereof; and
the cured liquid-crystal molecules has homogeneous orientation regularity in substantially the same direction as the slow axis direction of the substrate.

Advantageous Effects of Invention

The multilayer film and the optically anisotropic laminate of the present invention can provide an optically anisotropic layer that is capable of being used for a material for a phase difference plate such as a $\lambda/2$ wave plate and a $\lambda/4$ wave plate, that uniformly expresses phase difference in the plane, that can be efficiently manufactured, and that has a reduced number of defects due to generation of a heterogeneous matter. According to the manufacturing method of the present invention, the multilayer film of the present invention can be efficiently manufactured.

Furthermore, when an optically anisotropic layer having inverse wavelength distribution is formed using a polymerizable liquid crystal compound having inverse wavelength distribution as a material for cured liquid-crystal molecules, an optical material that has high manufacturing efficiency by diagonal stretching, high degree of design freedom of slow axis direction, uniform properties in the plane, a reduced number of defects due to a heterogeneous matter, and usefulness by virtue of inverse wavelength distribution, all of which are at high levels, can be provided.

The circular polarizing plate and the organic electroluminescent display device of the present invention are a circular polarizing plate and an organic electroluminescent display device that have uniform properties, that can be efficiently manufactured, and that have a reduced number of defects due to generation of a heterogeneous matter.

DESCRIPTION OF EMBODIMENTS

Figure 1:
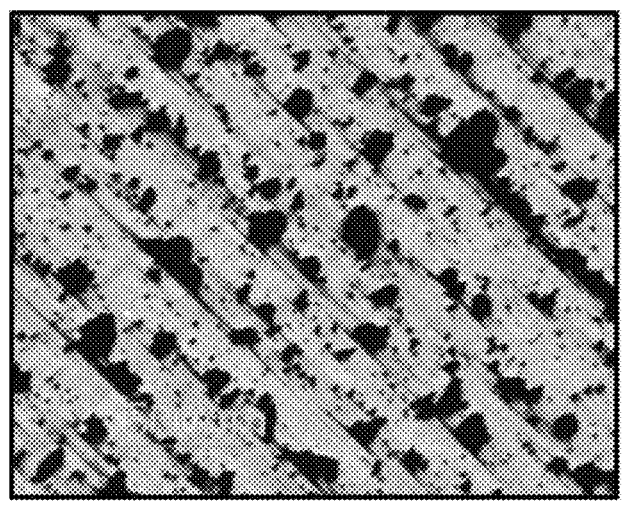
FIG. 1 is a photograph showing a specific example of an optically anisotropic layer having orientation defects.

Hereinafter, the present invention will be described in detail with reference to examples and embodiments, but the present invention is not limited to the following examples and embodiments and may be implemented with any optional modifications without departing from the scope of claims of the present invention and equivalents thereto.

In this application, a plate-shaped member such as a "polarizing plate", a "$\lambda/2$ wave plate", a "$\lambda/4$ wave plate", and a "phase difference plate", is not limited to a rigid member, and may have a film shape and flexibility.

[1. Multilayer Film]

The multilayer film of the present invention comprises a first long-length substrate and an optically anisotropic layer that is formed directly on the first substrate and contains cured liquid-crystal molecules.

The "cured liquid-crystal molecules" herein means molecules of a compound in a solidified product that is obtained by solidification wherein the compound that is capable of exhibiting a liquid crystal phase is solidified while keeping the state of exhibiting the liquid crystal phase. Examples of the cured liquid-crystal molecules may include a polymer obtained by polymerizing a polymerizable liquid crystal compound. Unless otherwise specified, this specific optically anisotropic layer containing the cured liquid-crystal molecules is simply referred to as "optically anisotropic layer" in the following description.

[1.1. First Substrate]

The first substrate used in the present invention is a long-length substrate. The "long-length" herein means a shape having a length that is at least 5 times or more longer than the width, and preferably 10 times or more longer than the width, and specifically means a shape of a film having such a length that the film can be wound up into a roll shape for storage or transport.

The first substrate used in the present invention has a slow axis in a direction different from the lengthwise direction of the substrate. Unless otherwise specified, the directions of slow axes of the first substrate and the optically anisotropic layer herein represent a direction of slow axis in an in-plane direction.

Unless otherwise specified, an angle representing the direction of slow axis of the substrate herein is with reference to the widthwise direction of the substrate, and represents an angle relative to this direction.

The angle formed between the slow axis of the first substrate and the lengthwise direction of the first substrate may be specifically 10° to 90°. When the first substrate has a slow axis at an angle falling within such a range, the multilayer film of the present invention may serve as a material capable of efficiently manufacturing a circular polarizing plate, and the like.

In a certain aspect, the angle formed between the slow axis of the first substrate and the lengthwise direction of the first substrate is preferably 30° to 80°, and particularly preferably 40° to 50°. When this angle relationship is satisfied, the multilayer film of the present invention may be a material capable of efficiently manufacturing a specific circular polarizing plate. Specifically, a circular polarizing plate having a linear polarizer and one layer of phase difference plate can be efficiently manufactured.

More specifically, when the angle formed between the slow axis of the first substrate and the lengthwise direction of the first substrate preferably falls within a specific range of 15°±5°, 45°±5°, 67.5°±5°, or 75°±5°, more preferably 15°±4°, 45°±4°, 67.5°±4°, or 75°±4°, and further preferably 15°±3°, 45°±3°, 67.5°±3°, or 75°±3°, the multilayer film of the present invention may serve as a material capable of efficiently manufacturing a specific circular polarizing plate.

The material for the first substrate is not particularly limited. Various resins capable of imparting an orientation-controlling force to the surface of the substrate by imparting birefringence may be used. Examples of the resins may include resins containing various types of polymers. Examples of the polymers may include an alicyclic structure-containing polymer, a cellulose ester, a polyvinyl alcohol, a polyimide, UV-transmitting acrylic, a polycarbonate, a polysulfone, a polyether sulfone, an epoxy polymer, a polystyrene, and combinations thereof. Among these, an alicyclic structure-containing polymer and a cellulose ester are preferred, and an alicyclic structure-containing polymer is more preferred from the viewpoint of transparency, low hygroscopicity, size stability, and low weight.

It is preferable that the first substrate is a film of a resin having positive intrinsic birefringence. When the resin having a positive intrinsic birefringence is used as the material, a first substrate having favorable properties such as high orientation-controlling force, high strength, and low cost can be easily obtained.

The alicyclic structure-containing polymer is an amorphous polymer having an alicyclic structure in a repeating unit. Either a polymer containing an alicyclic structure in a main chain or a polymer containing an alicyclic structure in a side chain may be used.

Examples of the alicyclic structure may include a cycloalkane structure and a cycloalkene structure. A cycloalkane structure is preferred from the viewpoint of thermal stability.

The number of carbon atoms constituting one repeating unit having the alicyclic structure is not particularly limited, but is usually 4 to 30, preferably 5 to 20, and more preferably 6 to 15.

The ratio of the repeating unit having the alicyclic structure in the alicyclic structure-containing polymer is appropriately selected depending on the purposes of use, and is usually 50% by weight or more, preferably 70% by weight or more, and more preferably 90% by weight or more.

When the ratio of the repeating unit having the alicyclic structure is too low, the heat resistance of the film may deteriorate.

Specific examples of the alicyclic structure-containing polymer may include (1) a norbornene polymer, (2) a monocyclic olefin polymer, (3) a cyclic conjugated diene polymer, and (4) a vinyl alicyclic hydrocarbon polymer, as well as hydrogenated products thereof.

Among these, a norbornene polymer and a hydrogenated product thereof are more preferred from the viewpoint of transparency and moldability.

Examples of the norbornene polymer may include a ring-opening polymer of a norbornene monomer, a ring-opening copolymer of a norbornene monomer with a ring-opening polymerizable monomer other than the norbornene monomer, and a hydrogenated product thereof; an addition polymer of a norbornene monomer, and an addition copolymer of a norbornene monomer with a copolymerizable monomer other than the norbornene monomer.

Among these, a hydrogenated product of ring-opening polymer of a norbornene monomer is the most preferred from the viewpoint of transparency.

The alicyclic structure-containing polymer is, for example, selected from known polymers disclosed in Japanese Patent Application Laid-Open No. 2002-321302 A and the like.

The glass transition temperature of the alicyclic structure-containing polymer is preferably 80° C. or higher, and more preferably within a range of 100 to 250° C. The alicyclic structure-containing polymer having a glass transition temperature falling within this range is not deformed or does not generate stress during use at high temperature, and has excellent durability.

The molecular weight of the alicyclic structure-containing polymer is a weight average molecular weight (Mw) measured by gel permeation chromatography (hereinafter abbreviated as "GPC") using cyclohexane (when a resin is not dissolved therein, toluene) as a solvent in terms of polyisoprene (in terms of polystyrene when the solvent is toluene). The molecular weight is usually 10,000 to 100,000, preferably 25,000 to 80,000, and more preferably 25,000 to 50,000.

When the weight average molecular weight thereof falls within such a range, the mechanical strength and molding processability of the film are highly balanced. Therefore, this is suitable.

The molecular weight distribution (weight average molecular weight (Mw)/number average molecular weight (Mn)) of the alicyclic structure-containing polymer is not particularly limited, and usually falls within a range of 1 to 10, preferably 1 to 4, and more preferably 1.2 to 3.5.

In a resin containing the alicyclic structure-containing polymer, the amount of a resin component having a molecular weight of 2,000 or less (i.e., oligomer component) contained therein is preferably 5% by weight or less, more preferably 3% by weight or less, and further preferably 2% by weight or less.

When the amount of the oligomer component falls within the aforementioned range, the generation of fine convex portions on a surface is decreased, the unevenness of thickness is decreased, and the surface profile evenness is improved.

In order to decrease the amount of the oligomer component, selection of a polymerization catalyst and a hydrogenation catalyst, reaction conditions of polymerization, hydrogenation, and the like, temperature conditions in a process of molding the resin as a molding material into pellets, and the like may be optimized.

The amount of the oligomer component may be measured by GPC as described above.

When the resin containing the alicyclic structure-containing polymer is used as the material for the first substrate, the thickness of the first substrate is not particularly limited. The thickness of the first substrate is usually 1 to 1,000 μm, preferably 5 to 300 μm, and more preferably 30 to 100 μm from the viewpoint of increased productivity and facilitation of reduction in thickness and weight saving.

The resin containing the alicyclic structure-containing polymer may be composed only of the alicyclic structure-containing polymer, or may contain any compounding agent as long as the effects of the present invention are not significantly impaired. The ratio of the alicyclic structure-containing polymer in the resin containing the alicyclic structure-containing polymer is preferably 70% by weight or more, and more preferably 80% by weight or more.

Specific suitable examples of the resin containing the alicyclic structure-containing polymer may include "ZEONOR 1420 and ZEONOR 1420R" available from ZEON CORPORATION.

A typical example of the cellulose ester is a lower fatty acid ester of cellulose (for example, cellulose acetate, cellulose acetate butyrate, and cellulose acetate propionate). A lower fatty acid means a fatty acid having 6 or less carbon atoms in one molecule. Cellulose acetate includes triacetylcellulose (TAC) and cellulose diacetate (DAC).

The acetylation degree of cellulose acetate is preferably 50 to 70%, and particularly preferably 55 to 65%. The weight average molecular weight of cellulose acetate is preferably 70,000 to 120,000, and particularly preferably 80,000 to 100,000. The aforementioned cellulose acetate may be partially esterified with not only acetic acid but also a fatty acid such as propionic acid and butyric acid as long as the aforementioned acetylation degree is satisfied. The resin constituting the first substrate may contain cellulose acetate in combination with a cellulose ester other than cellulose acetate (cellulose propionate, cellulose butyrate, etc.). In this case, it is preferable that the total amount of the cellulose esters satisfies the aforementioned acetylation degree.

When a film of triacetylcellulose is used as the first substrate, it is particularly preferable that such a film is a triacetylcellulose film formed using triacetylcellulose dope that is prepared by dissolving triacetylcellulose in a solvent essentially free of dichloromethane by a low-temperature dissolution method or a high-temperature dissolution method from the viewpoint of environmental conservation. The film of triacetylcellulose may be prepared by a co-casting method. The co-casting method may be performed by dissolving raw material flakes of triacetylcellulose in a solvent, and if necessary, adding any additive to prepare a solution (dope), casting the dope on a support from dope supply means (die), drying the cast product to some extent, separating the cast product as a film from the support when rigidity is imparted, and further drying the film to remove the solvent. Examples of the solvent for dissolving the raw material flakes may include a halogenated hydrocarbon (dichloromethane, etc.), an alcohol (methanol, ethanol, butanol, etc.), an ester (methyl formate, methyl acetate, etc.), and an ether (dioxane, dioxolane, diethyl ether, etc.). Examples of the additive added to the dope may include a retardation-increasing agent, a plasticizer, an ultraviolet absorber, a deterioration preventing agent, a lubricant, and a separation promoter. Examples of the support on which the dope is cast may include a horizontal endless metal belt and a rotation drum. For casting, a single dope may be cast in a single layer, or co-cast in a plurality of layers. In casting in a plurality of layers, for example, a plurality of dopes may be successively cast so that a layer of low-concentration cellulose ester dope and layers of high-concentration cellulose ester dope in contact with the front side and back side of the layer are formed. Examples of means for drying the film to remove the solvent may include means for conveying the film to pass the film through a drying unit in which the interior portion is placed under conditions suitable for drying.

Preferable examples of the film of triacetylcellulose may include any known films such as TAC-TD80U (available from Fuji Photo Film Co., Ltd.), and a film disclosed in JIII journal of technical disclosure No. 2001-1745. The thickness of the film of triacetylcellulose is not particularly limited, and is preferably 30 to 150 μm, more preferably 40 to 130 μm, and further preferably 70 to 120 μm.

The first substrate has an orientation-controlling force caused by stretching. Further, the first substrate has the slow axis in a direction different from the lengthwise direction of the first substrate.

Such a first substrate may be prepared by stretching a film such as the film made of the aforementioned material, to impart optical anisotropy. The stretching direction may be appropriately set depending on a desired orientation direction required for the optically anisotropic layer. The stretching may be performed by only diagonal stretching, only widthwise stretching (stretching in the widthwise direction of the first substrate), or a combination of diagonal stretching, lengthwise stretching (stretching in the lengthwise direction of the first substrate), and/or widthwise stretching. The stretching ratio may be appropriately set within a range that causes an orientation-controlling force on the surface of the substrate. When the resin having a positive intrinsic birefringence is used as the material for the first substrate, orientation in the stretching direction is given to molecules, and the slow axis is expressed in the stretching direction.

The phase difference Re in the in-plane direction of the first substrate is preferably 30 nm or more, and more preferably 50 nm or more, and is preferably 500 nm or less, and more preferably 300 nm or less. The lower limit of birefringence Δn of the first substrate is preferably 0.000050 or more, and more preferably 0.000070 or more. The upper limit of birefringence Δn of the first substrate is preferably 0.007500 or less, and more preferably 0.007000 or less. In particular, when the aforementioned resin containing the alicyclic structure-containing polymer or the resin containing triacetylcellulose is used as the material for the first substrate, and optical properties within the range are imparted, molecular directors can be substantially uniformly oriented over the entire thickness direction of the first substrate, to impart a favorable orientation-controlling force to the surface of the first substrate. The stretching may be performed by any known stretching machines such as a tenter stretching machine.

On the other hand, a rubbing treatment can impart an orientation-controlling force to only the surface layer of the substrate. Use of an optical orientation film can also impart an orientation-controlling force to only a thin-film surface layer of an orientation film layer. The orientation-controlling force expressed only on the surface layer is alleviated by effects of environment (heat, light, oxygen, etc.) over time. Thus, orientation defects may more frequently occur during formation of the optically anisotropic layer.

[1.2. Formation of Optically Anisotropic Layer on First Substrate]

The multilayer film of the present invention comprises an optically anisotropic layer that is formed directly on the first substrate and contains the cured liquid-crystal molecules.

The formation of the optically anisotropic layer "directly" on the first substrate means that the optically anisotropic layer is formed on the surface of the first substrate without another intervening layer. When the first substrate having an orientation-controlling force caused by stretching is employed and the optically anisotropic layer is formed directly on the first substrate, the optically anisotropic layer having a slow axis in a desired direction can be obtained without generation of dusts, generation of defects, nor contamination of a heterogeneous matter due to rubbing. As a result, an optically anisotropic layer having a reduced number of defects in orientation can be obtained. Specifically, the optically anisotropic layer may have a reduced number of defects and heterogeneous matters that are observed by a microscope and a reduced number of orientation defects such as line defects.

The optically anisotropic layer may typically be formed on the first substrate by a method including:

Step (I): a step of feeding out the specific long-length first substrate described above in the lengthwise direction;

Step (II): a step of directly applying onto the fed-out first substrate a liquid crystal composition containing a polymerizable liquid crystal compound to form a layer of the liquid crystal composition;

Step (III): a step of giving orientation to the polymerizable liquid crystal compound in the layer of the liquid crystal composition; and Step (IV): a step of polymerizing the polymerizable liquid crystal compound to form cured liquid-crystal molecules.

Step (I) may be performed by preparing a roll of the specific long-length first substrate described above, and feeding out the first substrate from the roll.

Step (II) may be performed by applying the liquid crystal composition directly onto one surface of the continuously conveyed first substrate. The conveyance direction of the substrate may be usually the same as the applying direction of the liquid crystal composition. Examples of the applying method may include a curtain coating method, an extrusion coating method, a roll coating method, a spin coating method, a dip coating method, a bar coating method, a spray coating method, a slide coating method, a printing coating method, a gravure coating method, a die coating method, a gap coating method, and a dipping method. For example, when a die coater is disposed in the die coating method so that the lip direction of the die coater is parallel to the widthwise direction of the substrate, the applying direction of the liquid crystal composition is the same as the conveyance direction of the substrate, that is, the lengthwise direction of the substrate. The thickness of layer of the liquid crystal composition to be applied may be appropriately set depending on a desired thickness required for the optically anisotropic layer.

Step (III) may be achieved immediately by coating, but if necessary, be achieved by an orientation treatment such as heating after coating. Conditions of the orientation treatment may be appropriately set depending on the properties of the liquid crystal composition to be used. For example, the conditions may be conditions of treatment for 30 seconds to 5 minutes under a temperature condition of 50 to 160° C. When the composition and treatment conditions of the liquid crystal composition to be used are appropriately set, orientation in substantially the same direction as the direction of slow axis of the first substrate can be achieved. Thereby, the applying direction of the liquid crystal composition to be used and the orientation direction of the polymerizable liquid crystal compound may become different, that is, may intersect. The angle formed between the applying direction of the liquid crystal composition and the orientation direction of the polymerizable liquid crystal compound may preferably be more than 5°, more preferably 10 to 90°, and further preferably 40 to 50°.

Step (IV) may be performed immediately after Step (III). Alternatively, a step of drying the layer of the liquid crystal composition may be performed, if necessary, before Step (IV) and after Step (III). The drying may be achieved by a drying method such as air drying, heated-air drying, drying under reduced pressure, and heated-air drying under reduced pressure. By the drying, the solvent can be removed from the layer of the liquid crystal composition.

At Step (IV), a method that is suitable for the properties of components of the liquid crystal composition such as the polymerizable compound and a polymerization initiator may be appropriately selected. Examples of the method may include a method of irradiation with an active energy beam and a thermal polymerization method. The method of irradiation with an active energy beam is preferred since a reaction can proceed at room temperature without heating. Examples of the active energy beam for irradiation in this method may include light such as visible light, ultraviolet light, and infrared light, and any energy beam such as an electron beam. A method of irradiation with light such as ultraviolet light is particularly preferred because of simple operation. The upper limit of temperature during irradiation with ultraviolet light is preferably equal to or lower than the glass transition temperature (Tg) of the substrate. The upper limit of temperature usually falls within a range of 150° C. or lower, preferably 100° C. or lower, and particularly preferably 80° C. or lower. The lower limit of temperature during irradiation with ultraviolet light may be 15° C. or higher. The irradiation intensity of ultraviolet light usually falls within a range of 0.1 mW/cm$^2$ to 1,000 mW/cm$^2$, and preferably 0.5 mW/cm$^2$ to 600 mW/cm$^2$. The irradiation time of ultraviolet light falls within a range of 1 second to 300 seconds, and preferably 5 seconds to 100 seconds. The integrated illuminance of ultraviolet light is calculated by the integrated illuminance of ultraviolet light (mJ/cm$^2$)=the irradiation intensity of ultraviolet light (mW/cm$^2$)×the irradiation time of ultraviolet light (second).

[1.3. Optically Anisotropic Layer]

In the multilayer film of the present invention, the cured liquid-crystal molecules may have orientation regularity in substantially the same direction as the direction of slow axis of the first substrate.

The cured liquid-crystal molecules may preferably have homogeneous orientation regularity in substantially the same direction as the direction of slow axis of the first substrate. Herein, "having homogeneous orientation regularity" means that an average direction of lines that are obtained by projecting long-axis directions of mesogens of the cured liquid-crystal molecules to a film face is aligned in a certain direction horizontal to the film face (for example, direction of surface director of film of the substrate). Furthermore, the homogeneous orientation regularity "in" the certain direction means that the alignment direction is substantially the same as the certain direction described above. For example, the certain direction is the direction of surface director of film of the substrate or the direction of slow axis of the substrate film. The presence or absence of homogeneous orientation regularity of the cured liquid-crystal molecules and the direction of the alignment may be confirmed by measurement of the slow axis direction using a phase difference meter typified by AxoScan (manufactured by Axometrics, Inc.) and measurement of retardation distribution at various incidence angles in the slow axis direction.

Herein, when the cured liquid-crystal molecules are obtained by polymerizing a polymerizable liquid crystal compound having a rod-like molecular structure, the long-axis direction of mesogen of the polymerizable liquid crystal compound is usually the long-axis direction of mesogen of the cured liquid-crystal molecules. When a plurality of types of mesogens having different orientation directions exist in the optically anisotropic layer in, e.g., the instance of using a polymerizable liquid crystal compound having inverse wavelength distribution (described below) as the polymerizable liquid crystal compound, a direction in which the long-axis direction of mesogen of the longest type among them is aligned is referred to as the alignment direction.

Further, the orientation in "substantially" the same direction as the direction of slow axis of the first substrate means that the angle formed between the direction of slow axis of the first substrate and the alignment direction of mesogen is 5° or less. The angle is preferably 3° or less, and more preferably 1° or less.

When the first substrate having the certain slow axis described above is used and a material for the optically anisotropic layer is appropriately selected, orientation regularity such as homogeneous orientation regularity in substantially the same direction as the direction of slow axis can be imparted to the optically anisotropic layer. Therefore, the optically anisotropic layer having such orientation regularity can be obtained.

The thickness of the optically anisotropic layer is not particularly limited, and may be appropriately adjusted so that properties such as retardation fall within a desired range. Specifically, the lower limit of the thickness is preferably 0.5 μm or more, and more preferably 1.0 μm or more, whereas the upper limit of the thickness is preferably 10 μm or less, more preferably 7 μm or less, and further preferably 5 μm or less.

The shape, and length and width of the optically anisotropic layer may be those of long-length film having the same shape as that of the first substrate. This optically anisotropic layer may be cut into a shape such as a rectangle suitable for desired application, if necessary.

It is preferable that the optically anisotropic layer has inverse wavelength distribution. That is, it is preferable that the optically anisotropic layer has wavelength distribution that exhibits higher in-plane phase difference for transmitted light having longer wavelength as compared with transmitted light having shorter wavelength. It is preferable that the optically anisotropic layer has inverse wavelength distribution at at least a part or preferably all of visible light region. When the optically anisotropic layer has inverse wavelength distribution, the function can be uniformly expressed over a wide region for optical applications such as a λ/4 wave plate and a λ/2 wave plate.

In a preferred aspect, the optically anisotropic layer is a λ/4 wave plate or a λ/2 wave plate. Specifically, when the in-plane retardation Re measured at a measurement wavelength of 550 nm falls within a range of 108 nm to 168 nm, the optically anisotropic layer may be used as a λ/4 wave plate. When the in-plane retardation Re measured at a measurement wavelength of 550 nm falls within a range of 245 nm to 305 nm, the optically anisotropic layer may be used as a λ/2 wave plate. More specifically, in a case of the λ/4 wave plate, the in-plane retardation Re measured at a measurement wavelength of 550 nm preferably falls within a range of 128 nm to 148 nm, and more preferably 133 nm to 143 nm. In a case of the λ/2 wave plate, the in-plane retardation Re measured at a measurement wavelength of 550 nm preferably falls within a range of 265 nm to 285 nm, and more preferably 270 nm to 280 nm. Herein, the in-plane retardation Re is calculated by the following equation.

$$Re = (nx - ny) \times d$$

(In the equation, nx is a refractive index of the optically anisotropic layer in an in-plane slow axis direction (maximum in-plane refractive index), ny is a refractive index of the optically anisotropic layer in a direction orthogonal to the in-plane slow axis direction, and d is a thickness of the optically anisotropic layer (nm).) When the optically anisotropic layer is such a λ/4 wave plate or such a λ/2 wave plate, an optical element such as a circular polarizing plate having the λ/4 wave plate or the λ/2 wave plate can be easily manufactured using the optically anisotropic layer.

The angle formed between the slow axis of the optically anisotropic layer and the lengthwise direction of the optically anisotropic layer may be the same as the angle formed between the slow axis of the first substrate and the lengthwise direction of the first substrate. Specifically, the angle formed between the slow axis of the optically anisotropic layer and the lengthwise direction of the optically anisotropic layer may be specifically 10° to 90°. In a certain aspect, the angle formed between the slow axis of the optically anisotropic layer and the lengthwise direction of the optically anisotropic layer is particularly preferably 40° to 50°. Specifically, the angle formed between the slow axis of the optically anisotropic layer and the lengthwise direction of the optically anisotropic layer may preferably fall within a specific range of 15°±5°, 45°±5°, 67.5°±5°, or 75°±5°, more preferably 15°±4°, 45°±4°, 67.5°±4°, or 75°±4°, and further preferably 15°±3°, 45°±3°, 67.5°±3°, or 75°±3°. When this angle relationship is satisfied, the multilayer film of the present invention may serve as a material capable of efficiently manufacturing a specific circular polarizing plate.

[1.4. Liquid Crystal Composition]

The liquid crystal composition containing the polymerizable liquid crystal compound that may be used for manufacturing of the multilayer film of the present invention (hereinafter the composition is sometimes abbreviated as "composition (A)") will be described.

The liquid crystal compound as a component of the composition (A) herein is a compound capable of exhibiting a liquid crystal phase when the compound is mixed in the composition (A) and oriented. The polymerizable liquid crystal compound is a liquid crystal compound that is capable of being polymerized while keeping a state of the liquid crystal phase in the composition (A) to form a polymer in which the orientation of molecules in the liquid crystal phase is maintained. Further, the polymerizable liquid crystal compound having inverse wavelength distribution is a polymerizable liquid crystal compound in which a polymer obtained as described above exhibits inverse wavelength distribution.

In this application, compounds having polymerizability (the polymerizable liquid crystal compound, other compounds having polymerizability, etc.) as the component of the composition (A) are sometimes collectively referred to as "polymerizable compound".

[1.4.1. Polymerizable Liquid Crystal Compound]

Examples of the polymerizable liquid crystal compound may include a liquid crystal compound having a polymerizable group, a compound capable of forming a side chain-type liquid crystal polymer, and a discotic liquid crystal compound. Examples of the liquid crystal compound having a polymerizable group may include rod-like liquid crystal compounds having a polymerizable group described in Japanese Patent Application Laid-Open Nos. Hei. 11-513360 A, 2002-030042 A, 2004-204190 A, 2005-263789 A, 2007-119415 A, and 2007-186430 A. Examples of the side chain-type liquid crystal polymer compound may include a side chain-type liquid crystal polymer compound described in Japanese Patent Application Laid-Open No. 2003-177242 A. Examples of product name of preferred liquid crystal compound may include "LC242" available from BASF. Specific examples of the discotic liquid crystal compound are described in Japanese Patent Application Laid-Open No. Hei. 8-50206 A, and documents (C. Destrade et al., Mol. Crysr. Liq. Cryst., vol. 71, page 111 (1981); Edited by the Chemical Society of Japan, Kikan Kagaku Sosetsu, No. 22, Ekisho-no-kagaku (Chemistry of Liquid Crystal), Chapter 5, Chapter 10 Section 2 (1994); B. Kohne et al., Angew. Chem. Soc. Chem. Comm., page 1794 (1985); and J. Zhang et al., J. Am. Chem. Soc., vol. 116, page 2655 (1994)). One type of each of these liquid crystal compound and polymerizable liquid crystal compound having inverse wavelength distribution described below may be used alone or two or more types thereof may be used in combination at any ratio.

[1.4.2. Polymerizable Liquid Crystal Compound having Inverse Wavelength Distribution]

As a part or all of the polymerizable liquid crystal compound, the polymerizable liquid crystal compound having inverse wavelength distribution may be used. When the polymerizable liquid crystal compound having inverse wavelength distribution is used, an optically anisotropic layer having inverse wavelength distribution can be easily obtained.

Examples of the polymerizable liquid crystal compound having inverse wavelength distribution may include a compound having in the molecule a main chain mesogen and a side chain mesogen bonded to the main chain mesogen. In a state where the polymerizable liquid crystal compound having inverse wavelength distribution is oriented, the side chain mesogen may be oriented in a direction different from that of the main chain mesogen. Therefore, the main chain mesogen and the side chain mesogen may be oriented in different directions in the optically anisotropic layer. By virtue of this orientation, the optically anisotropic layer may exhibit inverse wavelength distribution.

[1.4.2.1. Compound (I)]

Examples of the polymerizable liquid crystal compound having inverse wavelength distribution may include a compound represented by the following formula (I) (hereinafter sometimes referred to as "compound (I)").

Herein, $R^1$ represents a hydrogen atom or an alkyl group having 1 to 6 carbon atoms.

Examples of the alkyl group having 1 to 6 carbon atoms of $R^1$ may include a methyl group, an ethyl group, a n-propyl group, an isopropyl group, a n-butyl group, a sec-butyl group, a tert-butyl group, a n-pentyl group, and a n-hexyl group.

It is preferable that $R^1$ is a hydrogen atom or an alkyl group having 1 to 4 carbon atoms.

In the compound (I), it is preferable that $Y^1$ to $Y^8$ are each independently a chemical single bond, —O—, —O—C(=O)—, —C(=O)—O—, or —O—C(=O)—O—.

$G^1$ and $G^2$ are each independently a divalent aliphatic group optionally having a substituent and having 1 to 20 carbon atoms.

Examples of the divalent aliphatic group having 1 to 20 carbon atoms may include a divalent aliphatic group having a linear structure such as an alkylene group having 1 to 20 carbon atoms and an alkenylene group having 2 to 20 carbon atoms; and a divalent aliphatic group such as a cycloalkanediyl group having 3 to 20 carbon atoms, a cycloalkenediyl group having 4 to 20 carbon atoms, and a divalent alicyclic fused ring group having 10 to 30 carbon atoms.

Examples of the substituent in the divalent aliphatic groups of $G^1$ and $G^2$ may include a halogen atom such as a fluorine atom, a chlorine atom, a bromine atom, and an iodine atom; and an alkoxy group having 1 to 6 carbon atoms such as a methoxy group, an ethoxy group, a n-propoxy group, an isopropoxy group, a n-butoxy group, a sec-butoxy group, a tert-butoxy group, a n-pentyloxy group, and a n-hexyloxy group. Among these, a fluorine atom, a methoxy group, and an ethoxy group are preferred.

The aforementioned aliphatic groups may have —O—, —S—, —O—C(=O)—, —C(=O)—O—, —O—C(=O)—O—, —$NR^2$—C(=O)—, —C(=O)—$NR^2$—, —$NR^2$—, or —C(=O)— inserted therein, with a proviso that cases where two or more —O— or —S— groups are adjacently inserted are excluded. Herein, $R^2$ represents a hydrogen atom or an alkyl group having 1 to 6 carbon atoms, that are the same as those for $R^1$ described above. It is preferable that $R^2$ is a hydrogen atom or a methyl group.

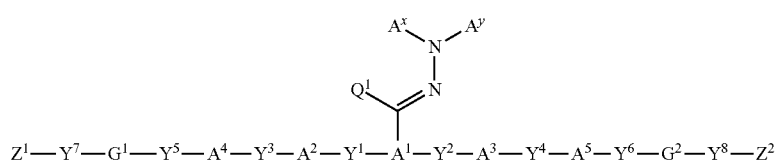

(I)

$Z^1$—$Y^7$—$G^1$—$Y^5$—$A^4$—$Y^3$—$A^2$—$Y^1$—$A^1$—$Y^2$—$A^3$—$Y^4$—$A^5$—$Y^6$—$G^2$—$Y^8$—$Z^2$

When the polymerizable liquid crystal compound having inverse wavelength distribution is the compound (I), a —$Y^5$-$A^4$-$Y^3$-$A^2$-$Y^1$-$A^1$-$Y^2$-$A^3$-$Y^4$-$A^5$-$Y^6$— group is the main chain mesogen, and a >$A^1$-C($Q^1$)=N—N($A^x$)$A^y$ group is the side chain mesogen. The $A^1$ group affects both properties of the main chain mesogen and the side chain mesogen.

In the formula, $Y^1$ to $Y^8$ are each independently a chemical single bond, —O—, —S—, —O—C(=O)—, —C(=O)—O—, —O—C(=O)—O—, —$NR^1$—C(=O)—, —C(=O)—$NR^1$—, —O—C(=O)—$NR^1$—, —$NR^1$—C(=O)—O—, —$NR^1$—C(=O)—$NR^1$—, —O—$NR^1$—, or —$NR^1$—O—.

It is preferable that the group inserted into the aliphatic groups is —O—, —O—C(=O)—, —C(=O)—O—, or —C(=O)—.

Specific examples of the aliphatic groups into which the groups are inserted may include —$CH_2$—$CH_2$—O—$CH_2$—$CH_2$—, —$CH_2$—$CH_2$—S—$CH_2$—$CH_2$—, —$CH_2$—$CH_2$—O—C(=O)—$CH_2$—$CH_2$—, —$CH_2$—$CH_2$—C(=O)—O—$CH_2$—$CH_2$—, —$CH_2$—$CH_2$—C(=O)—O—$CH_2$—, —$CH_2$—O—C(=O)—O—$CH_2$—$CH_2$—, —$CH_2$—$CH_2$—$NR^2$—C(=O)—$CH_2$—$CH_2$—, —$CH_2$—$CH_2$—C(=O)—$NR^2$—$CH_2$—, —$CH_2$—$NR^2$—$CH_2$—$CH_2$—, and —$CH_2$—C(=O)—$CH_2$—.

Among these, from the viewpoint of obtaining the desired effect of the present invention in more favorable manner, it is preferable that $G^1$ and $G^2$ are each independently a divalent aliphatic group having a linear structure such as an alkylene group having 1 to 20 carbon atoms and an alkenylene group having 2 to 20 carbon atoms, more preferably an alkylene group having 1 to 12 carbon atoms such as a methylene group, an ethylene group, a trimethylene group, a propylene group, a tetramethylene group, a pentamethylene group, a hexamethylene group, an octamethylene group, and a decamethylene group [—(CH$_2$)$_{10}$—], and particularly preferably a tetramethylene group [—(CH$_2$)$_4$—], a hexamethylene group [—(CH$_2$)$_6$—], an octamethylene group [—(CH$_2$)$_8$—], or a decamethylene group [—(CH$_2$)$_{10}$—].

$Z^1$ and $Z^2$ are each independently an alkenyl group having 2 to 10 carbon atoms that is unsubstituted or substituted by a halogen atom.

It is preferable that the number of carbon atoms in the alkenyl group is 2 to 6. Examples of the halogen atom that is a substituent in the alkenyl groups of $Z^1$ and $Z^2$ may include a fluorine atom, a chlorine atom, and a bromine atom. It is preferable that the halogen is a chlorine atom.

Specific examples of the alkenyl groups having 2 to 10 carbon atoms of $Z^1$ and $Z^2$ may include CH$_2$=CH—, CH$_2$=C(CH$_3$)—, CH$_2$=CH—CH$_2$—, CH$_3$—CH=CH—, CH$_2$=CH—CH$_2$—CH$_2$—, CH$_2$=C(CH$_3$)—CH$_2$—CH$_2$—, (CH$_3$)$_2$C=CH—CH$_2$—, (CH$_3$)$_2$C=CH—CH$_2$—CH$_2$—, CH$_2$=C(Cl)—, CH$_2$=C(CH$_3$)—CH$_2$—, and CH$_3$—CH=CH—CH$_2$—.

Among these, from the viewpoint of obtaining the desired effect of the present invention in more favorable manner, it is preferable that $Z^1$ and $Z^2$ are each independently CH$_2$=CH—, CH$_2$=C(CH$_3$)—, CH$_2$=C(Cl)—, CH$_2$=CH—CH$_2$—, CH$_2$=C(CH$_3$)—CH$_2$—, or CH$_2$=C(CH$_3$)—CH$_2$—CH$_2$—, more preferably CH$_2$=CH—, CH$_2$=C(CH$_3$)— or CH$_2$=C(Cl)—, and particularly preferably CH$_2$=CH—.

$A^x$ is an organic group having 2 to 30 carbon atoms that has at least one aromatic ring selected from the group consisting of an aromatic hydrocarbon ring and an aromatic heterocyclic ring.

In the present invention, "aromatic ring" means a cyclic structure having aromaticity in the broad sense based on Huckel rule, that is, a cyclic conjugated structure having (4n+2) π electrons, and a structure that exhibits aromaticity by involving a lone pair of heteroatom such as sulfur, oxygen, and nitrogen in a π electron system, typified by thiophene, furan, and benzothiazole.

The organic group having 2 to 30 carbon atoms that has at least one aromatic ring selected from the group consisting of an aromatic hydrocarbon ring and an aromatic heterocyclic ring, of $A^x$, may have a plurality of aromatic rings, or have an aromatic hydrocarbon ring and an aromatic heterocyclic ring.

Examples of the aromatic hydrocarbon ring may include a benzene ring, a naphthalene ring, and an anthracene ring. Examples of the aromatic heterocyclic ring may include a monocyclic aromatic heterocyclic ring such as a pyrrole ring, a furan ring, a thiophene ring, a pyridine ring, a pyridazine ring, a pyrimidine ring, a pyrazine ring, a pyrazole ring, an imidazole ring, an oxazole ring, and a thiazole ring; and a fused aromatic heterocyclic ring such as a benzothiazole ring, a benzoxazole ring, a quinoline ring, a phthalazine ring, a benzimidazole ring, a benzopyrazole ring, a benzofuran ring, a benzothiophene ring, a thiazolopyridine ring, an oxazolopyridine ring, a thiazolopyrazine ring, an oxazolopyrazine ring, a thiazolopyridazine ring, an oxazolopyridazine ring, a thiazolopyrimidine ring, and an oxazolopyrimidine ring.

The aromatic ring of $A^x$ may have a substituent. Examples of the substituent may include a halogen atom such as a fluorine atom and a chlorine atom; a cyano group; an alkyl group having 1 to 6 carbon atoms such as a methyl group, an ethyl group, and a propyl group; an alkenyl group having 2 to 6 carbon atoms such as a vinyl group and an allyl group; a halogenated alkyl group having 1 to 6 carbon atoms such as a trifluoromethyl group; a substituted amino group such as a dimethylamino group; an alkoxy group having 1 to 6 carbon atoms such as a methoxy group, an ethoxy group, and an isopropoxy group; a nitro group; an aryl group such as a phenyl group and a naphthyl group; —C(=O)—R$^5$; —C(=O)—OR$^5$; and —SO$_2$R$^6$. Herein, R$^5$ is an alkyl group having 1 to 20 carbon atoms, an alkenyl group having 2 to 20 carbon atoms, or a cycloalkyl group having 3 to 12 carbon atoms, and R$^6$ is an alkyl group having 1 to 20 carbon atoms, an alkenyl group having 2 to 20 carbon atoms, a phenyl group, or a 4-methylphenyl group, that are the same as those for R$^4$ described below.

The aromatic ring of $A^x$ may have a plurality of substituents that may be the same or different, and two adjacent substituents may be bonded together to form a ring. The formed ring may be a monocycle or a fused polycycle, and may be an unsaturated ring or a saturated ring.

The "number of carbon atoms" in the organic group having 2 to 30 carbon atoms of $A^x$ means the total number of carbon atoms in the entire organic group which excludes carbon atoms in the substituents (the same applies to $A^y$ described below).

Examples of the organic group having 2 to 30 carbon atoms that has at least one aromatic ring selected from the group consisting of an aromatic hydrocarbon ring and an aromatic heterocyclic ring of $A^x$ may include an aromatic hydrocarbon ring group; an aromatic heterocyclic ring group; an alkyl group having 3 to 30 carbon atoms that has at least one aromatic ring selected from the group consisting of an aromatic hydrocarbon ring group and an aromatic heterocyclic ring group; an alkenyl group having 4 to 30 carbon atoms that has at least one aromatic ring selected from the group consisting of an aromatic hydrocarbon ring group and an aromatic heterocyclic ring group; and an alkynyl group having 4 to 30 carbon atoms that has at least one aromatic ring selected from the group consisting of an aromatic hydrocarbon ring group and an aromatic heterocyclic ring group.

Preferable ones of specific examples of $A^x$ are as follows. However, in the present invention, $A^x$ is not limited to the following examples. In the following formulae, "—" represents an atomic bonding at any position of the ring (the same applies to the following).

(1) An Aromatic Hydrocarbon Ring Group

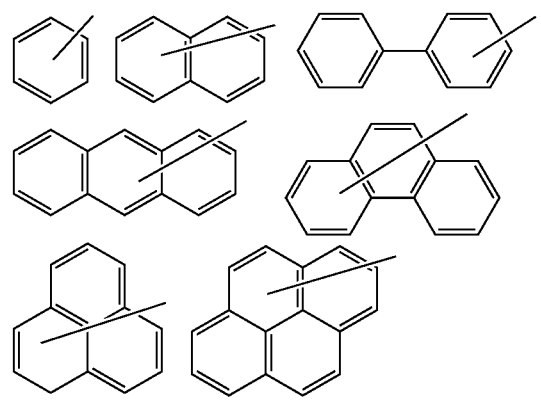

-continued

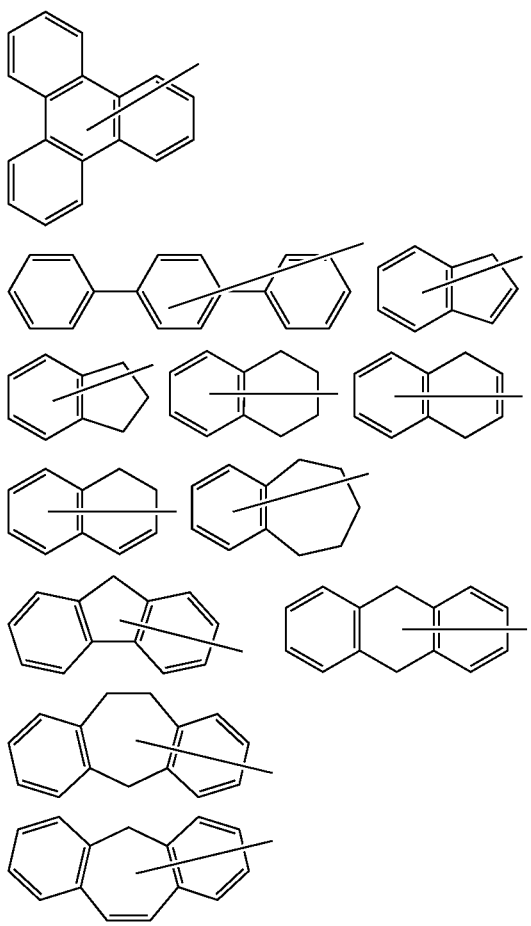

(2) An Aromatic Heterocyclic Ring Group

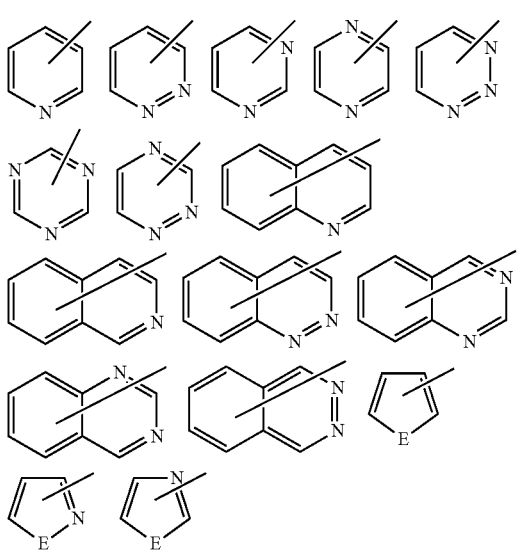

In the aforementioned formulae, E is NR$^{6a}$, an oxygen atom, or a sulfur atom. Herein, R$^{6a}$ is a hydrogen atom; or an alkyl group having 1 to 6 carbon atoms such as a methyl group, an ethyl group, and a propyl group.

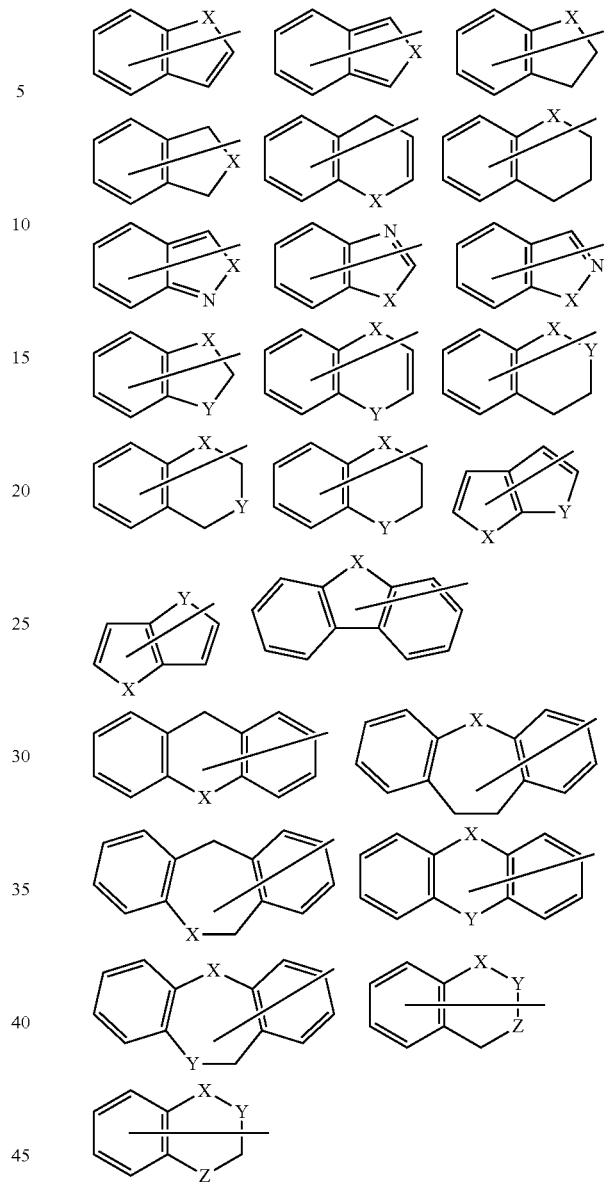

In the aforementioned formulae, X, Y, and Z are each independently NR$^7$, an oxygen atom, a sulfur atom, —SO—, or —SO$_2$— (provided that cases where an oxygen atom, a sulfur atom, —SO—, and —SO$_2$— are each adjacent are excluded). R$^7$ is a hydrogen atom; or an alkyl group having 1 to 6 carbon atoms such as a methyl group, an ethyl group, and a propyl group, that are the same as those for R$^{6a}$ described above.

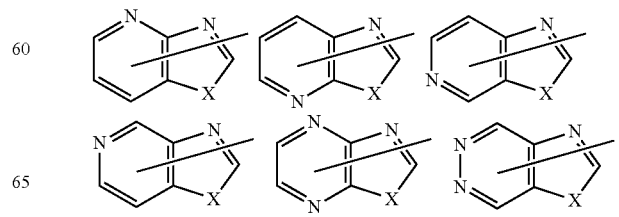

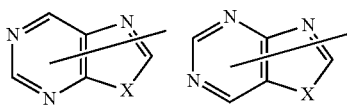

(In the aforementioned formulae, X has the same meanings as described above.)

(3) An Alkyl Group Having at Least One Aromatic Ring Selected from the Group Consisting of an Aromatic Hydrocarbon Ring Group and an Aromatic Heterocyclic Ring Group

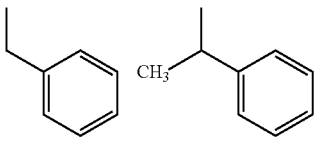

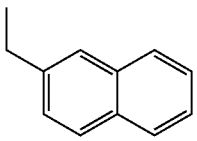

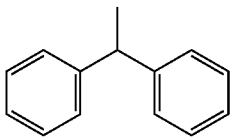

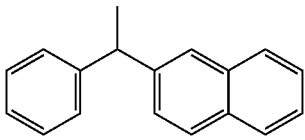

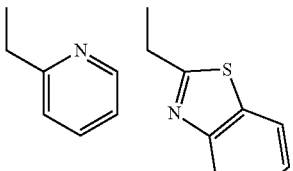

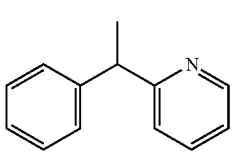

(4) An Alkenyl Group Having at Least One Aromatic Ring Selected from the Group Consisting of an Aromatic Hydrocarbon Ring Group and an Aromatic Heterocyclic Ring Group

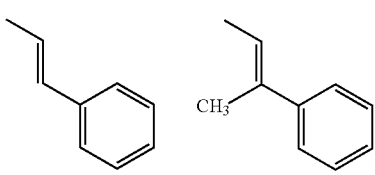

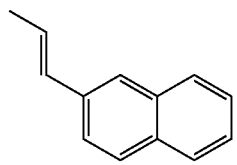

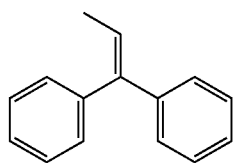

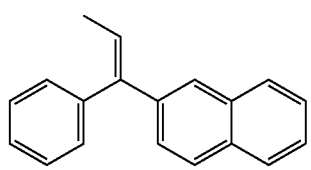

(5) An Alkynyl Group Having at Least One Aromatic Ring Selected from the Group Consisting of an Aromatic Hydrocarbon Ring Group and an Aromatic Heterocyclic Ring Group

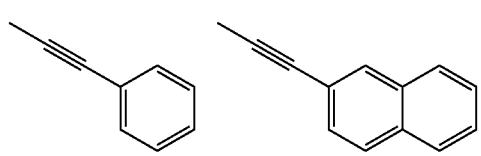

Among the groups of $A^x$, an aromatic hydrocarbon group having 6 to 30 carbon atoms and an aromatic heterocyclic ring group having 4 to 30 carbon atoms are preferred. Any of the groups shown below are more preferred.

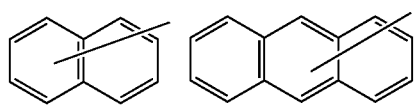

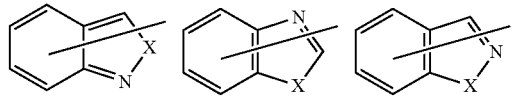

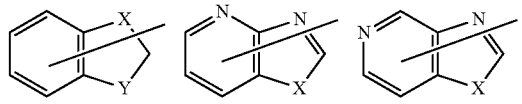

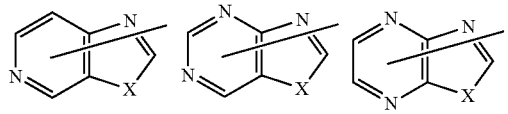

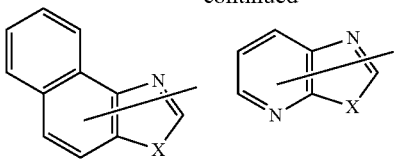

Any of the groups shown below is further preferred.

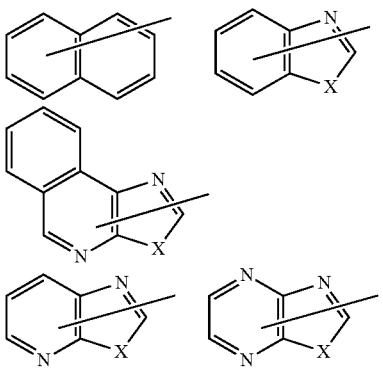

The ring of $A^x$ may have a substituent. Examples of the substituent may include a halogen atom such as a fluorine atom and a chlorine atom; a cyano group; an alkyl group having 1 to 6 carbon atoms such as a methyl group, an ethyl group, and a propyl group; an alkenyl group having 2 to 6 carbon atoms such as a vinyl group and an allyl group; a halogenated alkyl group having 1 to 6 carbon atoms such as a trifluoromethyl group; a substituted amino group such as a dimethylamino group; an alkoxy group having 1 to 6 carbon atoms such as a methoxy group, an ethoxy group, and an isopropyl group; a nitro group; an aryl group such as a phenyl group and a naphthyl group; —C(=O)—$R^9$; —C(=O)—$OR^9$; and —$SO_2R^6$. Herein, $R^8$ is an alkyl group having 1 to 6 carbon atoms such as a methyl group and an ethyl group; or an aryl group having 6 to 14 carbon atoms such as a phenyl group. Among these, a halogen atom, a cyano group, an alkyl group having 1 to 6 carbon atoms, and an alkoxy group having 1 to 6 carbon atoms are preferred.

The ring of $A^x$ may have a plurality of substituents that are the same or different, and two adjacent substituents may be bonded together to form a ring. The formed ring may be a monocycle or a fused polycycle.

The "number of carbon atoms" in the organic group having 2 to 30 carbon atoms of $A^x$ means the total number of carbon atoms in the entire organic group which excludes carbon atoms in the substituents (the same applies to $A^y$ described below).

$A^y$ is a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, —C(=O)—$R^3$, —$SO_2$—$R^4$, —C(=S)NH—$R^9$, or an organic group having 2 to 30 carbon atoms that has at least one aromatic ring selected from the group consisting of an aromatic hydrocarbon ring and an aromatic heterocyclic ring. Herein, $R^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon group having 5 to 12 carbon atoms, $R^4$ is an alkyl group having 1 to 20 carbon atoms, an alkenyl group having 2 to 20 carbon atoms, a phenyl group, or a 4-methylphenyl group, and $R^9$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic group having 5 to 20 carbon atoms and optionally having a substituent.

Examples of the alkyl group having 1 to 20 carbon atoms in the alkyl group having 1 to 20 carbon atoms and optionally having a substituent of $A^y$ may include a methyl group, an ethyl group, a n-propyl group, an isopropyl group, a n-butyl group, an isobutyl group, a 1-methylpentyl group, a 1-ethylpentyl group, a sec-butyl group, a tert-butyl group, a n-pentyl group, an isopentyl group, a neopentyl group, a n-hexyl group, an isohexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, and a n-icosyl group. The number of carbon atoms in the alkyl group having 1 to 20 carbon atoms and optionally having a substituent is preferably 1 to 12, and further preferably 4 to 10.

Examples of the alkenyl group having 2 to 20 carbon atoms in the alkenyl group having 2 to 20 carbon atoms and optionally having a substituent of $A^y$ may include a vinyl group, a propenyl group, an isopropenyl group, a butenyl group, an isobutenyl group, a pentenyl group, a hexenyl group, a heptenyl group, an octenyl group, a decenyl group, an undecenyl group, a dodecenyl group, a tridecenyl group, a tetradecenyl group, a pentadecenyl group, a hexadecenyl group, a heptadecenyl group, an octadecenyl group, a nonadecenyl group, and an icocenyl group.

The number of carbon atoms in the alkenyl group having 2 to 20 carbon atoms and optionally having a substituent is preferably 2 to 12.

Examples of the cycloalkyl group having 3 to 12 carbon atoms in the cycloalkyl group having 3 to 12 carbon atoms and optionally having a substituent of $A^y$ may include a cyclopropyl group, a cyclobutyl group, a cyclopentyl group, a cyclohexyl group, and a cyclooctyl group.

Examples of the alkynyl group having 2 to 20 carbon atoms in the alkynyl group having 2 to 20 carbon atoms and optionally having a substituent of $A^y$ may include an ethynyl group, a propynyl group, a 2-propynyl group (propargyl group), a butynyl group, a 2-butynyl group, a 3-butynyl group, a pentynyl group, a 2-pentynyl group, a hexynyl group, a 5-hexynyl group, a heptynyl group, an octynyl group, a 2-octynyl group, a nonanyl group, a decanyl group, and a 7-decanyl group.

Examples of the substituents in the alkyl group having 1 to 20 carbon atoms and optionally having a substituent and the alkenyl group having 2 to 20 carbon atoms and optionally having a substituent, of $A^y$, may include a halogen atom such as a fluorine atom and a chlorine atom; a cyano group; a substituted amino group such as a dimethylamino group; an alkoxy group having 1 to 20 carbon atoms such as a methoxy group, an ethoxy group, an isopropyl group, and a butoxy group; an alkoxy group having 1 to 12 carbon atoms that is substituted by an alkoxy group having 1 to 12 carbon atoms such as a methoxymethoxy group and a methoxyethoxy group; a nitro group; an aryl group such as a phenyl group and a naphthyl group; a cycloalkyl group having 3 to 8 carbon atoms such as a cyclopropyl group, a cyclopentyl group, and a cyclohexyl group; a cycloalkyloxy group having 3 to 8 carbon atoms such as a cyclopentyloxy group and a cyclohexyloxy group; a cyclic ether group having 2 to 12 carbon atoms such as a tetrahydrofuranyl group, a tetrahydropyranyl group, a dioxolanyl group, and a dioxanyl group; an aryloxy group having 6 to 14 carbon atoms such as a phenoxy group and a naphthoxy group; a fluoroalkoxy group having 1 to 12 carbon atoms with at least one substitution by a fluoro atom, such as a trifluoromethyl group, a pentafluoroethyl group, and —$CH_2CF_3$; a benzofuryl group; a benzopyranyl group; a benzodioxolyl group; a benzodioxanyl group; —C(=O)—$R^{7a}$; —C(=O)—$OR^{7a}$; —$SO_2$—$R^{8a}$; —$SR^{10}$; an alkoxy group having 1 to 12 carbon atoms that is substituted by —$SR^{10}$; and a hydroxyl group. Herein, $R^{7a}$ and $R^H$ are each independently an alkyl group having 1 to 20 carbon atoms, an alkenyl group having 2 to 20 carbon atoms, a cycloalkyl group having 3 to 12 carbon atoms, or an aromatic hydrocarbon group having 6 to 12 carbon atoms, and $R^{8a}$ is an alkyl group having 1 to 20 carbon atoms, an alkenyl group having 2 to 20 carbon atoms, a phenyl group, or a 4-methylphenyl group, that are the same as those for $R^4$ described above.

Examples of the substituent in the cycloalkyl group having 3 to 12 carbon atoms and optionally having a substituent of $A^y$ may include a halogen atom such as a fluorine atom and a chlorine atom; a cyano group; a substituted amino group such as a dimethylamino group; an alkyl group having 1 to 6 carbon atoms such as a methyl group, an ethyl group, and a propyl group; an alkoxy group having 1 to 6 carbon atoms such as a methoxy group, an ethoxy group, and an isopropyl group; a nitro group; an aryl group such as a phenyl group and a naphthyl group; a cycloalkyl group having 3 to 8 carbon atoms such as a cyclopropyl group, a cyclopentyl group, and a cyclohexyl group; —C(=O)—$R^{7a}$; —C(=O)—$OR^{7a}$; —$SO_2R^{8a}$; and a hydroxyl group. Herein, $R^{7a}$ and $R^{8a}$ have the same meanings as described above.

Examples of the substituent in the alkynyl group having 2 to 20 carbon atoms and optionally having a substituent of $A^y$ may include substituents that are the same as the substituents in the alkyl group having 1 to 20 carbon atoms and optionally having a substituent and the alkenyl group having 2 to 20 carbon atoms and optionally having a substituent.

In the group represented by —C(=O)—$R^3$ of $A^y$, $R^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon group having 5 to 12 carbon atoms. Specific examples thereof may include those exemplified as the examples of the alkyl group having 1 to 20 carbon atoms and optionally having a substituent, the alkenyl group having 2 to 20 carbon atoms and optionally having a substituent, and the cycloalkyl group having 3 to 12 carbon atoms and optionally having a substituent, of $A^y$ described above.

In the group represented by —$SO_2$—$R^4$ of $A^y$, $R^4$ is an alkyl group having 1 to 20 carbon atoms, an alkenyl group having 2 to 20 carbon atoms, a phenyl group, or a 4-methylphenyl group.

Specific examples of the alkyl group having 1 to 20 carbon atoms and the alkenyl group having 2 to 20 carbon atoms, of $R^4$, may include those exemplified as the examples of the alkyl group having 1 to 20 carbon atoms and the alkenyl group having 2 to 20 carbon atoms, of $A^y$ described above.

Examples of the organic group having 2 to 30 carbon atoms that has at least one aromatic ring selected from the group consisting of an aromatic hydrocarbon ring and an aromatic heterocyclic ring of $A^y$ may include those exemplified as the examples of $A^x$ described above.

Among these, it is preferable that $A^y$ is a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, —C(=O)—$R^3$, —$SO_2$—$R^4$, or an organic group having 2 to 30 carbon atoms that has at least one aromatic ring selected from the group consisting of an aromatic hydrocarbon ring and an aromatic heterocyclic ring, and further preferably a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, an aromatic hydrocarbon group having 6 to 12 carbon atoms and optionally having a substituent, an aromatic heterocyclic ring group having 3 to 9 carbon atoms and optionally having a substituent, or a group represented by —C(=O)—$R^3$ or —$SO_2$—$R^4$. Herein, $R^3$ and $R^4$ have the same meanings as described above.

It is preferable that substituents in the alkyl group having 1 to 20 carbon atoms and optionally having a substituent, the alkenyl group having 2 to 20 carbon atoms and optionally having a substituent, and the alkynyl group having 2 to 20 carbon atoms and optionally having a substituent, of $A^y$ are a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a phenylsulfonyl group, a 4-methylphenylsulfonyl group, a benzoyl group, or —$SR^{10}$. Herein, $R^{10}$ has the same meanings as described above.

It is preferable that substituents in the cycloalkyl group having 3 to 12 carbon atoms and optionally having a substituent, the aromatic hydrocarbon group having 6 to 12 carbon atoms and optionally having a substituent, and the aromatic heterocyclic group having 3 to 9 carbon atoms and optionally having a substituent, of $A^y$ are a fluorine atom, an alkyl group having 1 to 6 carbon atoms, an alkoxy group having 1 to 6 carbon atoms, or a cyano group.

$A^x$ and $A^y$ may together form a ring. Examples of the ring may include an unsaturated heterocyclic ring having 4 to 30 carbon atoms and an unsaturated carbon ring having 6 to 30 carbon atoms which may optionally have a substituent.

The aforementioned unsaturated heterocyclic ring having 4 to 30 carbon atoms and the aforementioned unsaturated carbon ring having 6 to 30 carbon atoms are not particularly restricted, and may or may not have aromaticity. Examples thereof may include rings shown below. The rings shown below are a moiety of:

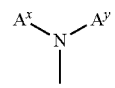

in the formula (I).

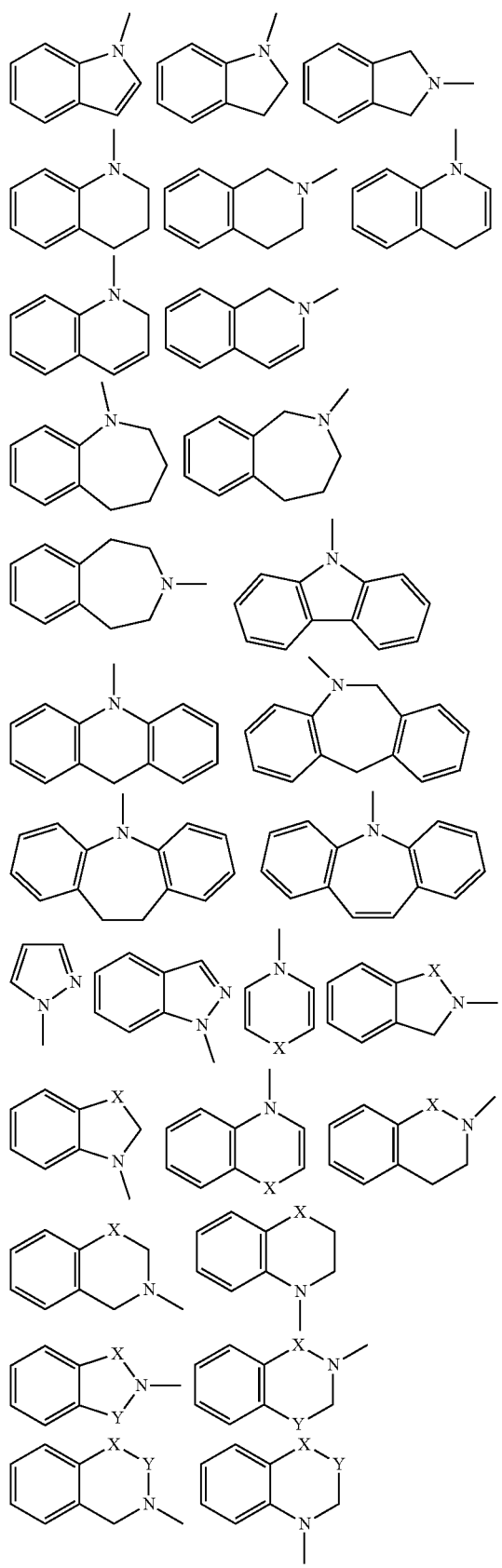

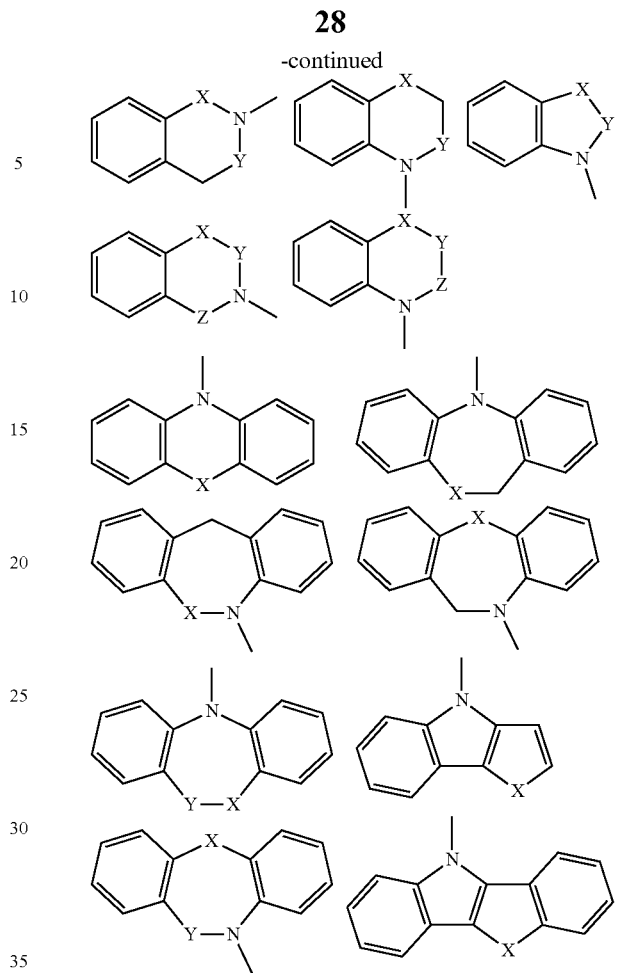

(In the formulae, X, Y, and Z have the same meanings as described above.)

The rings may have a substituent. Examples of the substituent may include those exemplified as the examples of the substituent in the aromatic ring of $A^x$.

The total number of π electrons in $A^x$ and $A^y$ is preferably 4 or more and 24 or less, more preferably 6 or more and 20 or less, and further preferably 6 or more and 18 or less from the viewpoint of obtaining the desired effect of the present invention in more favorable manner.

Examples of preferred combination of $A^x$ and $A^y$ may include:

(α) a combination of $A^x$ and $A^y$ in which $A^x$ is an aromatic hydrocarbon group having 4 to 30 carbon atoms or an aromatic heterocyclic ring group having 4 to 30 carbon atoms, $A^y$ is a hydrogen atom, a cycloalkyl group having 3 to 8 carbon atoms, an aromatic hydrocarbon group having 6 to 12 carbon atoms and optionally having a substituent group (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —$SR^{10}$; and (β) a combination of $A^x$ and $A^y$ in which $A^x$ and $A^y$ together form an unsaturated heterocyclic ring or an unsaturated carbon ring. Herein, $R^{10}$ has the same meanings as described above.

Examples of further preferred combination of $A^x$ and $A^y$ may include (γ) a combination of $A^x$ and $A^y$ in which $A^x$ is any of groups having the following structures, $A^y$ is a hydrogen atom, a cycloalkyl group having 3 to 8 carbon atoms, an aromatic hydrocarbon group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —$SR^{10}$. Herein, $R^{10}$ has the same meanings as described above.

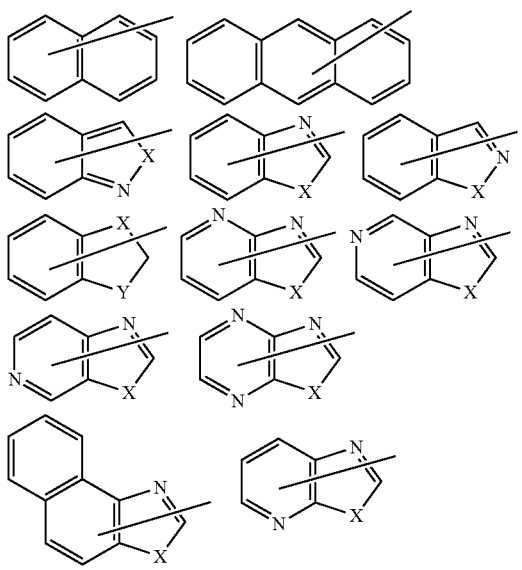

(In the formulae, X and Y have the same meanings as described above.)

Examples of particularly preferred combination of $A^x$ and $A^y$ may include (δ) a combination of $A^x$ and $A^y$ in which $A^x$ is any of groups having the following structures, $A^y$ is a hydrogen atom, a cycloalkyl group having 3 to 8 carbon atoms, an aromatic hydrocarbon group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —$SR^{10}$. In the following formulae, X has the same meanings as described above. Herein, $R^{10}$ has the same meanings as described above.

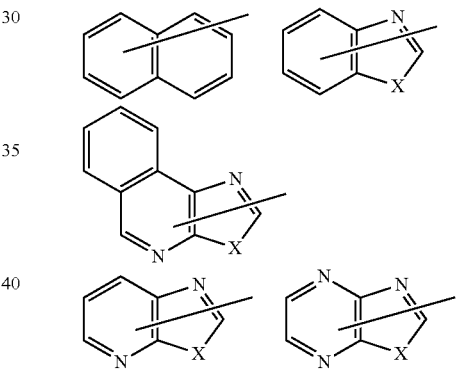

$A^1$ is a trivalent aromatic group optionally having a substituent. The trivalent aromatic group may be a trivalent carbocyclic aromatic group or a trivalent heterocyclic aromatic group. From the viewpoint of obtaining the desired effect of the present invention in more favorable manner, it is preferable that the trivalent aromatic group is the trivalent carbocyclic aromatic group, more preferably a trivalent benzene ring group or a trivalent naphthalene ring group, and further preferably a trivalent benzene ring group or a trivalent naphthalene ring group that is represented by the following formula.

In the following formulae, substituents $Y^1$ and $Y^2$ are described for the sake of convenience to clearly show a bonding state ($Y^1$ and $Y^2$ have the same meanings as described above, and the same applied to the following).

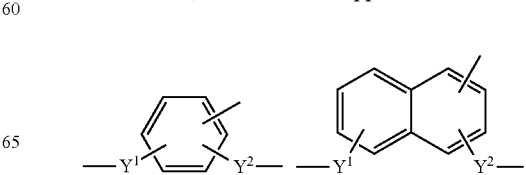

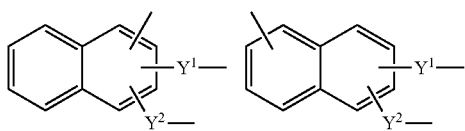

Among these, it is preferable that $A^1$ is a group represented by each of the following formulae (A11) to (A25), further preferably a group represented by the following formula (A11), (A13), (A15), (A19), or (A23), and particularly preferably a group represented by the following formula (A11) or (A23).

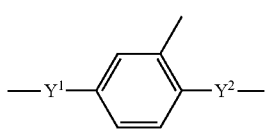

(A11)

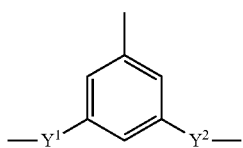

(A12)

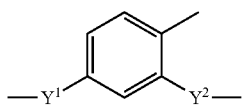

(A13)

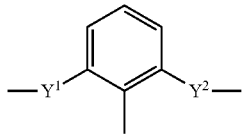

(A14)

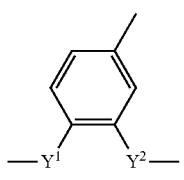

(A15)

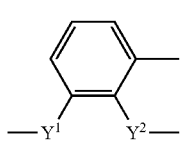

(A16)

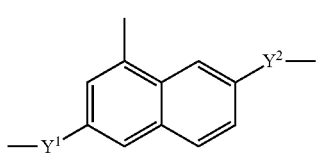

(A17)

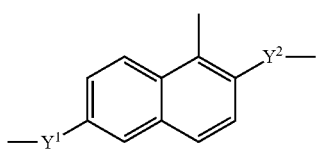

(A18)

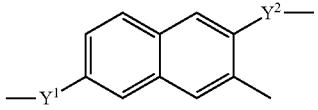

(A19)

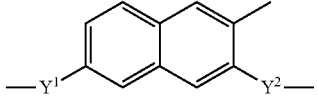

(A20)

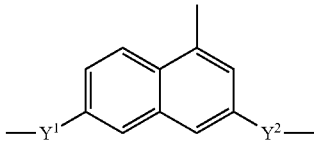

(A21)

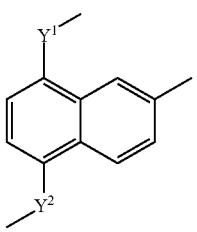

(A22)

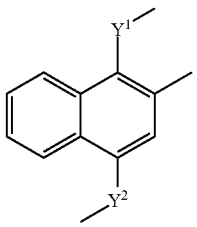

(A23)

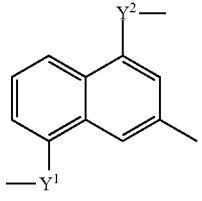

(A24)

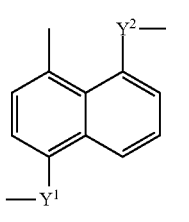

(A25)

Examples of the substituent that may be included in the trivalent aromatic group of $A^1$ may include those exemplified as the examples of the substituent in the aromatic group of $A^x$ described above. It is preferable that $A^1$ is a trivalent aromatic group having no substituent.

$A^2$ and $A^3$ are each independently a divalent alicyclic hydrocarbon group having 3 to 30 carbon atoms and optionally having a substituent.

Examples of the divalent alicyclic hydrocarbon group having 3 to 30 carbon atoms may include a cycloalkanediyl group having 3 to 30 carbon atoms and a divalent alicyclic fused ring group having 10 to 30 carbon atoms.

Examples of the cycloalkanediyl group having 3 to 30 carbon atoms may include a cyclopropanediyl group; a cyclobutanediyl group such as a cyclobutane-1,2-diyl group and a cyclobutane-1,3-diyl group; a cyclopentanediyl group such as a cyclopentane-1,2-diyl group and a cyclopentane-1,3-diyl group; a cyclohexanediyl group such as a cyclohexane-1,2-diyl group, a cyclohexane-1,3-diyl group, and a cyclohexane-1,4-diyl group; a cycloheptanediyl group such as a cycloheptane-1,2-diyl group, a cycloheptane-1,3-diyl group, and a cycloheptane-1,4-diyl group; a cyclooctanediyl group such as a cyclooctane-1,2-diyl group, a cyclooctane-1,3-diyl group, a cyclooctane-1,4-diyl group, and a cyclooctane-1,5-diyl group; a cyclodecanediyl group such as a cyclodecane-1,2-diyl group, a cyclodecane-1,3-diyl group, a cyclodecane-1,4-diyl group, and a cyclodecane-1,5-diyl group; a cyclododecanediyl group such as a cyclododecane-1,2-diyl group, a cyclododecane-1,3-diyl group, a cyclododecane-1,4-diyl group, and a cyclododecane-1,5-diyl group; a cyclotetradecanediyl group such as a cyclotetradecane-1,2-diyl group, a cyclotetradecane-1,3-diyl group, a cyclotetradecane-1,4-diyl group, a cyclotetradecane-1,5-diyl group, and a cyclotetradecane-1,7-diyl group; and a cycloeicosanediyl group such as a cycloeicosane-1,2-diyl group and a cycloeicosane-1,10-diyl group.

Examples of the divalent alicyclic fused ring group having 10 to 30 carbon atoms may include a decalindiyl group such as a decalin-2,5-diyl group and a decalin-2,7-diyl group; an adamantanediyl group such as an adamantane-1,2-diyl group and an adamantane-1,3-diyl group; and a bicyclo[2.2.1]heptanediyl group such as a bicyclo[2.2.1]heptane-2,3-diyl group, a bicyclo[2.2.1]heptane-2,5-diyl group, and a bicyclo[2.2.1]heptane-2,6-diyl group.

The divalent alicyclic hydrocarbon groups may further have a substituent at any position. Examples of the substituent may include those exemplified as the examples of the substituent in the aromatic group of $A^x$ described above.

Among these, it is preferable that $A^2$ and $A^3$ are a divalent alicyclic hydrocarbon group having 3 to 12 carbon atoms, more preferably a cycloalkanediyl group having 3 to 12 carbon atoms, further preferably a group represented by each of the following formulae (A31) to (A34):

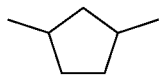

(A31)

(A32)

(A33)

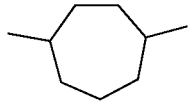

(A34)

and particularly preferably the group represented by the aforementioned formula (A32).

The aforementioned divalent alicyclic hydrocarbon group having 3 to 30 carbon atoms may exist in forms of cis- and trans-stereoisomers that are based on difference of configuration of carbon atoms bonded to $Y^1$ and $Y^3$ (or $Y^2$ and $Y^4$).

For example, when the group is a cyclohexane-1,4-diyl group, a cis-isomer (A32a) and a trans-isomer (A32b) may exist, as described below.

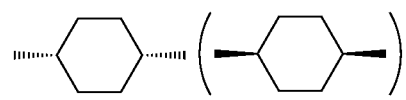

(A32a)

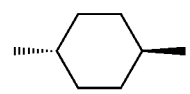

(A32b)

In the present invention, the group may be a cis-isomer, a trans-isomer, or an isomeric mixture of cis- and trans-isomers. It is preferable that the group is the trans-isomer or the cis-isomer, and more preferably the trans-isomer since orientation is favorable.

$A^4$ and $A^5$ are each independently a divalent aromatic group having 6 to 30 carbon atoms and optionally having a substituent.

The aromatic groups of $A^4$ and $A^5$ may be monocyclic or polycyclic.

Specific examples of preferable $A^4$ and $A^5$ are as follows.

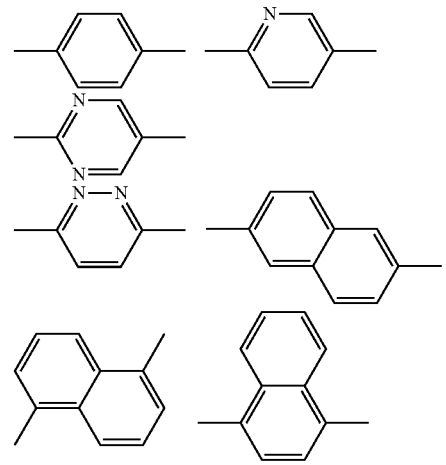

The divalent aromatic groups of $A^4$ and $A^5$ may have a substituent at any position. Examples of the substituent may include a halogen atom, a cyano group, a hydroxyl group, an alkyl group having 1 to 6 carbon atoms, an alkoxy group having 1 to 6 carbon atoms, a nitro group, and a —C(=O)—$OR^{8b}$ group. Herein, $R^{8b}$ is an alkyl group having 1 to 6 carbon atoms. Among these, a halogen atom, an alkyl group having 1 to 6 carbon atoms, and an alkoxy group are preferred. Of the halogen atom, a fluorine atom is more preferred. Of the alkyl group having 1 to 6 carbon atoms, a methyl group, an ethyl group, and a propyl group are more preferred. Of the alkoxy group, a methoxy group and an ethoxy group are more preferred.

Among these, from the viewpoint of obtaining the desired effect of the present invention in more favorable manner, it is more preferable that $A^4$ and $A^5$ are each independently a group represented by the following formulae (A41), (A42), or (A43) that optionally have a substituent, and particularly preferable that $A^4$ and $A^5$ are the group represented by the formula (A41) that optionally has a substituent.

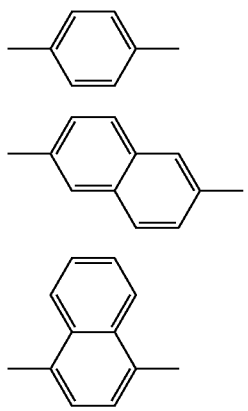

(A41)

(A42)

(A43)

$Q^1$ is a hydrogen atom or an alkyl group having 1 to 6 carbon atoms and optionally having a substituent.

Examples of the alkyl group having 1 to 6 carbon atoms and optionally having a substituent may include those exemplified as the examples of $A^x$ described above.

Among these, it is preferable that $Q^1$ is a hydrogen atom or an alkyl group having 1 to 6 carbon atoms, and more preferably a hydrogen atom or a methyl group.

The compound (I) may be produced by a reaction of a hydrazine compound with a carbonyl compound, described in, e.g., International publication WO2012/147904.

[1.4.3. Polymerizable Monomer]

The composition (A) may contain a polymerizable monomer as an optional component. Herein, the "polymerizable monomer" represents, among compounds that have polymerization ability and capability of acting as a monomer, the compound other than the polymerizable liquid crystal compound having inverse wavelength distribution.

As the polymerizable monomer, for example, a monomer having one or more polymerizable groups per molecule may be used. When the polymerizable monomer has such a polymerizable group, polymerization can be achieved in formation of the optically anisotropic layer. When the polymerizable monomer is a crosslinkable monomer having two or more polymerizable groups per molecule, cross-linking polymerization can be achieved. Examples of the polymerizable groups may include groups that are the same as the groups of $Z^1$—$Y^7$— and $Z^2$—$Y^8$— in the compound (I). More specific examples thereof may include an acryloyl group, a methacryloyl group, and an epoxy group.

The polymerizable monomer itself may have liquid crystallinity or non-liquid crystallinity. Herein, that the monomer itself has "non-liquid crystallinity" means that even when the polymerizable monomer itself is left at any temperature of room temperature to 200° C., the monomer does not exhibit orientation on the first substrate that has been subjected to an orientation treatment. The presence or absence of orientation is determined by whether or not the presence or absence of light-dark contrast appears during rotation of the rubbing direction in the face in cross-Nicol transmission observation with a polarized light microscope.

The content ratio of the polymerizable monomer in the composition (A) is usually 1 to 100 parts by weight, and preferably 5 to 50 parts by weight, relative to 100 parts by weight of the polymerizable liquid crystal compound having inverse wavelength distribution. When the content ratio of the polymerizable monomer is appropriately adjusted within such a range so as to exhibit desired inverse wavelength distribution, the inverse wavelength distribution is easily controlled with precision.

The polymerizable monomer may be produced by any known production method. When the polymerizable monomer has a structure similar to the compound (I), the polymerizable monomer may be produced in a similar manner to the method for producing the compound (I).

[1.4.4. Other Components in Composition (A)]

If necessary, the composition (A) may contain any optional component such as those in the following examples, in addition to the polymerizable liquid crystal compound and the polymerizable monomer.

The composition (A) may contain a polymerization initiator. The polymerization initiator may be appropriately selected depending on the types of polymerizable groups of the polymerizable liquid crystal compound, the polymerizable monomer, and another polymerizable compound in the composition (A). For example, when the polymerizable group is radical polymerizable, a radical polymerization initiator may be used. When the polymerizable group is anionic polymerizable, an anionic polymerization initiator may be used. When the polymerizable group is cationic polymerizable, a cationic polymerization initiator may be used.

As the radical polymerization initiator, any of a thermal radical generator being a compound that generates active species capable of initiating polymerization of the polymerizable compound by heating; and a photo-radical generator being a compound that generates active species capable of initiating polymerization of the polymerizable compound by exposure of exposed light such as visible light, ultraviolet light (i-line, etc.), far-ultraviolet light, electron beam, and X-ray may be used. The photo-radical generator is suitably used.

Examples of the photo-radical generator may include an acetophenone-based compound, a biimidazole-based compound, a triazine-based compound, an O-acyl oxime-based compound, an onium salt-based compound, a benzoin-based compound, a benzophenone-based compound, an α-diketone-based compound, a polynuclear quinone-based compound, a xanthone-based compound, a diazo-based compound, and an imide sulfonate-based compound, which are described in International publication WO2012/147904.

Examples of the anionic polymerization initiator may include an alkyl lithium compound; a monolithium salt or a monosodium salt of biphenyl, naphthalene, and pyrene; and a polyfunctional initiator such as a dilithium salt and a trilithium salt.

Examples of the cationic polymerization initiator may include a protonic acid such as sulfuric acid, phosphoric acid, perchloric acid, and trifluoromethanesulfonic acid; a Lewis acid such as boron trifluoride, aluminum chloride, titanium tetrachloride, and tin tetrachloride; and an aromatic onium salt, and a combination of an aromatic onium salt with a reductant.

One type of the polymerization initiator may be used alone, or two or more types thereof may be used in combination.

The content ratio of the polymerization initiator in the composition (A) is usually 0.1 to 30 parts by weight, and preferably 0.5 to 10 parts by weight, relative to 100 parts by weight of the polymerizable compound.

The composition (A) may contain a surfactant for adjustment of surface tension. The surfactant is not particularly limited. A nonionic surfactant is usually preferable. As the nonionic surfactant, a commercially available product may be used. Examples thereof may include a nonionic surfactant that is an oligomer having a molecular weight of several thousands, for example, KH-40 available from Seimi Chemical Co., Ltd. The content ratio of the surfactant in the composition (A) is usually 0.01 to 10 parts by weight, and preferably 0.1 to 2 parts by weight, relative to 100 parts by weight of the polymerizable compound.

The composition (A) may contain a solvent such as an organic solvent. Examples of the organic solvent may include a ketone such as cyclopentanone, cyclohexanone, methyl ethyl ketone, acetone, and methyl isobutyl ketone; an acetate ester such as butyl acetate and amyl acetate; a halogenated hydrocarbon such as chloroform, dichloromethane, and dichloroethane; an ether such as 1,4-dioxane, cyclopentyl methyl ether, tetrahydrofuran, tetrahydropyran, 1,3-dioxolane, and 1,2-dimethoxyethane; and an aromatic hydrocarbon such as toluene, xylene, and mesitylene. The boiling point of the solvent is preferably 60 to 250° C., and more preferably 60 to 150° C. from the viewpoint of excellent handleability. The amount of the solvent to be used is usually 100 to 1,000 parts by weight relative to 100 parts by weight of the polymerizable compound.

The composition (A) may further contain an optional additive such as a metal, a metal complex, a dye, a pigment, a fluorescent material, a phosphorescent material, a leveling agent, a thixotropic agent, a gelator, a polysaccharide, an ultraviolet light absorber, an infrared light absorber, an antioxidant, an ion exchange resin, and a metal oxide such as titanium oxide. The content ratio of the optional additive in the polymerizable composition of the present invention is usually 0.1 to 20 parts by weight relative to 100 parts by weight of the polymerizable compound.

The composition (A) may be usually prepared by mixing the components described above.

[2. Optically Anisotropic Laminate]

The optically anisotropic laminate of the present invention is obtained by separating the optically anisotropic layer from the multilayer film of the present invention and attaching the optically anisotropic layer to a second long-length substrate.

One example of the second substrate is a film capable of protecting the optically anisotropic layer, such as a masking film. As the masking film, any known films (for example, FF1025 and "FF1035" available from Tredegar Corporation; "SAT116T", "SAT2038T-JSL", and "SAT4538T-JSL" available from Sun A. Kaken Co., Ltd.; "NBO-0424", "TFB-K001", "TFB-K0421", and "TFB-K202" available from Fujimori Kogyo Co., Ltd.; "DT-2200-25" and "K-6040" available from Hitachi Chemical Co., Ltd.; and "6010#75", "6010#100", "6011#75", and "6093#75" available from Teraoka Seisakusho Co., Ltd.) may be used. From the optically anisotropic laminate having such a second substrate, the optically anisotropic layer can be easily transferred to another member. Therefore, an optical element having the optically anisotropic layer can be easily manufactured.

Another example of the second substrate is a substrate film having optical isotropy. Optical isotropy specifically represents that the in-plane retardation Re is preferably less than 10 nm, and more preferably less than 5 nm. In an optically isotropic substrate, it is preferable that the retardation Rth in a thickness direction is also less than 10 nm, and more preferably less than 5 nm. The retardation Rth in the thickness direction is calculated by the following equation.

$$Rth=[\{(nx+ny)/2\}-nz]\times d$$

(In the equation, nx is a refractive index of the substrate film in an in-plane slow axis direction (maximum in-plane refractive index), ny is a refractive index of the substrate film in a direction orthogonal to the in-plane slow axis direction, nz is a refractive index of the substrate film in the thickness direction, and d is the thickness (nm) of the substrate film.)

Examples of the material for the optical isotropic substrate film may include a cellulose ester in addition to those exemplified as the examples of the first substrate film described above. A long-length film of such a material is formed, and the long-length film as it is may be used without stretching as the second substrate. The optically anisotropic laminate having the optically isotropic substrate film as the second substrate as it is may be incorporated into an optical device such as a display device, and may be used as an optical member.

In manufacturing of the optically anisotropic laminate of the present invention, a step of separating the optically anisotropic layer from the multilayer film and attaching the optically anisotropic layer to the second long-length substrate may be performed by a roll-to-roll operation.

[3. Circular Polarizing Plate]

The circular polarizing plate of the present invention is obtained by attaching one or more layers of the optically anisotropic layer to a long-length linear polarizer by a roll-to-roll process.

Specific aspects of the circular polarizing plate of the present invention may include two aspects described below.

Circular polarizing plate (i): a circular polarizing plate obtained by attaching the optically anisotropic layer to a long-length linear polarizer by a roll to roll process, wherein the optically anisotropic layer is a layer separated from the multilayer film of the present invention.

Circular polarizing plate (ii): a circular polarizing plate obtained by attaching a long-length λ/4 wave plate, a long-length λ/2 wave plate, and a long-length linear polarizer by a roll to roll process, wherein the long-length λ/4 wave plate, the long-length λ/2 wave plate, or both the wave plates are the optically anisotropic layer separated from the multilayer film of the present invention.

As the optically anisotropic layer contained in the circular polarizing plate of the present invention, the optically anisotropic layer separated from the multilayer film of the present invention may be used as it is. Alternatively, as the optically anisotropic layer contained in the circular polarizing plate of the present invention, the optically anisotropic layer that is separated from the multilayer film of the present invention and attached to the second substrate to form the optically anisotropic laminate of the present invention may be used as it is, and the optically anisotropic layer that is further separated from the optically anisotropic laminate may also be used.

Any of a step of separating the optically anisotropic layer from the multilayer film and a step of attaching the optically anisotropic layer to another layer (another optically anisotropic layer, linear polarizer, etc.) may be first performed. For example, the separating step and the attaching step may be performed by attaching a face of the multilayer film on an optically anisotropic layer side to a face of the linear polarizer and then separating the first substrate.

In the circular polarizing plate (ii), relationship of the slow axis of the λ/4 wave plate, the slow axis of the λ/2 wave plate, and the transmission axis of the linear polarizer may be various known relationship. For example, when the optically anisotropic layer of the multilayer film of the present invention is used for both the λ/4 wave plate and the λ/2 wave plate, a relationship in which the angle of the direction of slow axis of the λ/2 wave plate relative to the direction of transmission axis of the polarizer is 15° or an angle close to 15° (for example, 15°±5°, preferably 15°±4°, and more preferably) 15°±3° and the angle of the direction of slow axis of the ¼λ wave plate relative to the direction of transmission axis of the polarizer is 75° or an angle close to 75° (for example, 75°±5°, preferably 75°±4°, and more preferably) 75°±3° may be established. With such an aspect, the circular polarizing plate may be used as a broad wavelength range anti-reflective film for an organic EL display device.

In a product according to the present invention (multilayer film, circular polarizing plate, display device, etc.), a relationship of angle formed between a direction of an in-plane optical axis (slow axis, transmission axis, transmission axis, etc.) and a geometric direction (the lengthwise direction and widthwise direction of the film, etc.) are defined as follows. A shift in a certain direction is positive, and a shift in the other direction is negative. The positive and negative directions are commonly defined in components of the product. For example, in a circular polarizing plate, "the direction of slow axis of the λ/2 wave plate relative to the direction of transmission axis of the linear polarizer is 15° and the direction of slow axis of the ¼λ wave plate relative to the direction of transmission axis of the linear polarizer is 75°" represents two cases described below:

When the circular polarizing plate is observed from one face thereof, the direction of slow axis of the λ/2 wave plate shifts clockwise by 15° from the direction of transmission axis of the linear polarizer and the direction of slow axis of the ¼λ wave plate shifts clockwise by 75° from the direction of transmission axis of the linear polarizer.

When the circular polarizing plate is observed from one face thereof, the direction of slow axis of the λ/2 wave plate shifts counterclockwise by 15° from the direction of transmission axis of the linear polarizer and the direction of slow axis of the ¼λ wave plate shifts counterclockwise by 75° from the direction of transmission axis of the linear polarizer.

A specific aspect of the circular polarizing plate (i) may be an aspect in which the circular polarizing plate has one layer of λ/4 wave plate as an optically anisotropic layer and the angle of the direction of slow axis of the λ/4 wave plate relative to the transmission axis of the linear polarizer is 45° or an angle close to 45° (for example, 45°±5°, preferably 45°±4°, and more preferably 45°±3°). With such an aspect, the circular polarizing plate may be used as an anti-reflective film for an organic EL display device.

Attaching by a roll-to-roll process represents an aspect in which a step of feeding out a film from a roll of long-length film, conveying the film, and attaching the film to another film on a conveyance line is performed, and the attached product is wound into a take-up roll. For example, when the linear polarizer and the multilayer film are attached, a step of feeding out the multilayer film from a roll of long-length multilayer film, conveying the film, and attaching the film to the linear polarizer on a conveyance line is performed, and the attached product is wound into a take-up roll. Thus, attaching by a roll-to-roll process may be performed. In this case, the linear polarizer may also be supplied to the attaching step by feeding out from a roll.

As the linear polarizer, any known polarizers used for a device such as a liquid crystal display device and other optical devices may be used. Examples of the linear polarizer may include a linear polarizer obtained by effecting adsorption of iodine or dichroic dye to a polyvinyl alcohol film, and uniaxially stretching the film in a boric acid bath, and a linear polarizer obtained by effecting absorption of iodine or dichroic dye to a polyvinyl alcohol film, stretching the film, and modifying one moiety of polyvinyl alcohol unit in the molecular chain into a polyvinylene unit. Other examples of the linear polarizer may include a polarizer having a function of separating light into polarized reflected light and transmitted light, such as a grid polarizer, a multi-layer polarizer, and a cholesteric liquid crystal polarizer. Among these, a polarizer containing polyvinyl alcohol is preferred.

When natural light reaches the polarizer used in the present invention, only one polarized light passes therethrough. The polarization degree of the polarizer used in the present invention is not particularly limited, and is preferably 98% or more, and more preferably 99% or more. The average thickness of the polarizer is preferably 5 to 80 μm.

One of applications of the circular polarizing plate of the present invention may be an application as an anti-reflective film for a display device having an organic EL element. Specifically, the circular polarizing plate having the aforementioned configuration is provided on a surface of the display device so that a face on a linear polarizer side is disposed toward a visual observation side. This can suppress radiation of light that has entered from the outside of the display device and then been reflected within the display device to the outside of the display device. As a result, undesired phenomena in light such as glare on a display face of the display device can be suppressed. Specifically, among the light that has entered from the outside of the device, only a part of linearly polarized light passes through the linear polarizer, and then passes through the optically anisotropic layer, resulting in circularly polarized light. The circularly polarized light herein includes elliptically polarized light as long as an anti-reflection function is substantially expressed. The circularly polarized light is reflected on a component that reflects light in the display device (reflection electrode in the organic EL element, etc.), and then passes through the optically anisotropic layer again, resulting in linearly polarized light having a polarization axis in a direction orthogonal to the polarization axis of the linear polarizer having entered. Thus, the light does not pass through the liner polarizer. The anti-reflection function can thereby be achieved. In particular, the circular polarizing plate (ii) described above can achieve the anti-reflection function at a broad wavelength range. Since the circular polarizing plate of the present invention has a reduced number of defects due to a heterogeneous matter in the optically anisotropic layer, the effect of anti-reflection can be obtained in particularly favorable manner. For example, an optically anisotropic layer having a relationship of three-dimensional refractive indices (nx, ny, and nz) that satisfies "nx>ny=nz", "nx>ny>nz", or "nx>nz>ny" can be used. When an optically anisotropic layer having a relationship of three-dimensional refractive indices of "nx>nz>ny" is used, the circular polarizing plate has not only an anti-reflection function in a frontal direction but also an anti-reflection function in a diagonal direction.

The circular polarizing plate of the present invention may have another optional layer, if necessary. Examples of the optional layer may include an adhesion layer for adhesion to another member, a mat layer for improving the sliding property of the film, a hard-coat layer such as an impact-resistant polymethacrylate resin layer, an anti-reflection layer, and an anti-fouling layer.

[4. Display Device]

The circular polarizing plate of the present invention may be used as a component of a display device such as a liquid crystal display device and an organic EL display device. As a particularly preferable aspect, the organic EL display device of the present invention comprises the circular polarizing plate of the present invention. Specifically, the organic EL display device of the present invention is a display device having an organic EL element as a display element in which the circular polarizing plate of the present invention may be provided as the anti-reflective film, as described above.

[5. Resin Film (X)]

The resin film disclosed in this application (hereinafter referred to as "resin film (X)") is a resin film that is formed on a long-length substrate and contains a cured liquid-crystal molecules. The "cured liquid-crystal molecules" means as described in the section of [1. Multilayer Film]. Examples of the cured liquid-crystal molecules may include a polymer obtained by polymerizing the polymerizable liquid crystal compound. In the following description, the "resin film (X) containing the cured liquid-crystal molecules" is sometimes abbreviated as "liquid crystal resin film". The resin film (X) may be used as the optically anisotropic layer in the multilayer film of the present invention.

[5.1. Substrate]

The substrate has a slow axis in a direction different from the widthwise direction thereof. Unless otherwise specified, the directions of slow axes of the substrate and the resin film (X) used herein represent a direction of slow axis in an in-plane direction. "Difference" between the slow axis direction and the widthwise direction means that the angle formed between the slow axis direction and the widthwise direction is 5° or more. The upper limit of the angle formed between the slow axis direction and the widthwise direction is not particularly limited, and may be, for example, 90° or less. The angle formed between the slow axis direction and the widthwise direction may be appropriately adjusted depending on a desired performance required for the liquid crystal resin film, and for example, may be 45°±3° or 22.5°±3°. When the substrate has such a slow axis, homogeneous orientation regularity in substantially the same direction as the slow axis direction can be imparted to the resin film (X) formed on the substrate.

The material for the substrate is not particularly limited. Various resins capable of imparting an orientation-controlling force to the surface of the substrate by imparting birefringence can be used.

Specifically, the same material as the material for the first substrate described in the section of [1.1. First Substrate] may be used.

As the method for providing the substrate with a slow axis, a stretching method may be typically adapted. Specifically, a film formed from the aforementioned material is stretched to impart anisotropy, to thereby prepare a substrate having a slow axis. The stretching direction may be appropriately set depending on the desired orientation direction required for the liquid crystal resin film. The stretching may be performed by only diagonal stretching or a combination of diagonal stretching, lengthwise stretching (stretching in the lengthwise direction of the substrate), and/or widthwise stretching (stretching in the widthwise direction of the substrate). The stretching ratio may be appropriately set so that the birefringence Δn of the substrate falls within a desired range. The lower limit of birefringence Δn of the substrate is preferably 0.000050 or more, and more preferably 0.000070 or more. On the other hand, the upper limit of birefringence Δn of the substrate is preferably 0.007500 or less, and more preferably 0.007000 or less. In particular, when the aforementioned resin containing the alicyclic structure-containing polymer or the resin containing triacetylcellulose is used as the material for the substrate, and a birefringence equal to or more than the lower limit is imparted, a favorable orientation-controlling force can be imparted to the surface of the substrate. When the birefringence is equal to or less than the aforementioned upper limit, the liquid crystal resin film can be used for various applications such as a λ/4 wave plate without separation from the substrate. The stretching may be performed by any known stretching machines such as a tenter stretching machine.

[5.2. Formation of Liquid Crystal Resin Film on Substrate]

The formation of the liquid crystal resin film on the substrate may be typically performed by a method including:

Step (i): a step of applying onto the substrate the liquid crystal composition containing the polymerizable liquid crystal compound to form a layer of the liquid crystal composition;

Step (ii): a step of giving homogeneous orientation to the polymerizable liquid crystal compound in the layer of the liquid crystal composition, the orientation being in substantially the same direction as the direction of slow axis of the substrate; and Step (iii): a step of polymerizing the polymerizable liquid crystal compound to form the cured liquid-crystal molecules (hereinafter referred to as "method (X)").

Step (i) may be performed by applying the liquid crystal composition onto one surface of the continuously conveyed substrate. Examples of the applying method may include a curtain coating method, an extrusion coating method, a roll coating method, a spin coating method, a dip coating method, a bar coating method, a spray coating method, a slide coating method, a printing coating method, a gravure coating method, a die coating method, a cap coating method, and a dipping method. The thickness of layer of the liquid crystal composition to be applied may be appropriately set depending on a desired thickness required for the liquid crystal resin film.

Step (ii) may be achieved immediately by coating, but if necessary, be achieved by an orientation treatment such as heating after coating. Conditions of the orientation treatment may be appropriately set depending on the properties of the liquid crystal composition to be used. For example, the conditions may be treatment conditions at a temperature of 50 to 160° C. for 30 seconds to 5 minutes. When the composition and treatment conditions of the liquid crystal composition to be used are appropriately set, homogeneous orientation in substantially the same direction as the direction of slow axis of the substrate can be achieved.

Step (iii) may be performed immediately after Step (ii). Alternatively, a step of drying the layer of the liquid crystal composition may be performed, if necessary, before Step (iii) and after Step (ii). The drying may be achieved by a drying method such as air drying, heated-air drying, drying under reduced pressure, and heated-air drying under reduced pressure. By the drying, a solvent can be removed from the layer of the liquid crystal composition.

At Step (iii), a method that is suitable for the properties of components of the liquid crystal composition such as the polymerizable compound and the polymerization initiator may be appropriately selected. Examples of the method may include a method of irradiation with an active energy beam and a thermal polymerization method. The method of irradiation with an active energy beam is preferred since a reaction can proceed at room temperature without heating. Examples of the active energy beam for irradiation in this method may include light such as visible light, ultraviolet light, and infrared light, and any energy beam such as an electron beam. A method of irradiation with light such as ultraviolet light is preferred because of simple operation. The upper limit of temperature during irradiation with ultraviolet light is preferably equal to or lower than the glass transition temperature (Tg) of the substrate. The upper limit of temperature usually falls within a range of 150° C. or lower, preferably 100° C. or lower, and particularly preferably 80° C. or lower. The lower limit of temperature during irradiation with ultraviolet light may be 15° C. or higher. The irradiation intensity of ultraviolet light usually falls within a range of 0.1 mW/cm$^2$ to 1,000 mW/cm$^2$, and preferably 0.5 mW/cm$^2$ to 600 mW/cm$^2$.

[5.3. Liquid Crystal Resin Film]

In the resin film (X), the cured liquid-crystal molecules may have homogeneous orientation regularity in substantially the same direction as the direction of slow axis of the substrate.

When the cured liquid-crystal molecules are obtained by polymerizing the polymerizable liquid crystal compound, the long-axis direction of mesogen of the polymerizable liquid crystal compound is the long-axis direction of mesogen of the cured liquid-crystal molecules. When a plurality of types of mesogens having different orientation directions exist in the liquid crystal resin film in, e.g., the instance of using the polymerizable liquid crystal compound having inverse wavelength distribution as the polymerizable liquid crystal compound, a direction in which the long-axis direction of mesogen of the longest type among them is aligned is referred to as the alignment direction.

Further, the orientation in "substantially" the same direction as the direction of slow axis of the substrate means that the angle formed between the direction of slow axis of the substrate and the alignment direction of mesogen is 5° or less. The angle is preferably 3° or less, and more preferably 1° or less.

When the substrate has a specific slow axis described above and the material for the liquid crystal resin film is appropriately selected, homogeneous orientation regularity in substantially the same direction as the slow axis direction can be imparted to the resin film (X) formed on the substrate. As a result, the liquid crystal resin film having such specific orientation regularity can be obtained.

The thickness of the liquid crystal resin film is not particularly limited, and may be appropriately adjusted so that properties such as retardation fall within a desired range. Specifically, the lower limit of the thickness is preferably 0.5 µm or more, and more preferably 1.0 µm or more, whereas the upper limit of the thickness is preferably 10 µm or less, and more preferably 7 µm or less.

The shape, length, and width of the liquid crystal resin film are not particularly limited, and may be those of long-length film having the same shape as that of the substrate. This liquid crystal resin film may be cut into a shape such as a rectangle suitable for desired application, if necessary.

It is preferable that the resin film (X) has inverse wavelength distribution. That is, it is preferable that the resin film (X) has wavelength distribution that exhibits higher in-plane phase difference for transmitted light having longer wavelength as compared with transmitted light having shorter wavelength. It is preferable that the resin film (X) has inverse wavelength distribution at least a part or preferably all of visible light region. When the liquid crystal resin film has inverse wavelength distribution, the function can be uniformly expressed over a wide region for optical applications such as a λ/4 wave plate and a λ/2 wave plate.

As the polymerizable liquid crystal compound such as the polymerizable liquid crystal compound having inverse wavelength distribution and the liquid crystal composition containing the polymerizable liquid crystal compound, the same compound and composition as described above as the materials for the optically anisotropic layer may be used.

[6. λ/4 Wave Plate (X)]

The resin film (X) may be used for optical applications such as a phase difference plate, and in particular, as a wave plate such as a λ/4 wave plate and a λ/2 wave plate. In particular, the resin film (X) is preferably used as a component of a λ/4 wave plate (X) described below.

The λ/4 wave plate (X) comprises the resin film (X). The λ/4 wave plate (X) may be composed only of the resin film (X). Specifically, the liquid crystal resin film formed on the substrate film is separated from the substrate, and cut into a desired shape suitable for the application such as a rectangle, and the cut liquid crystal resin film may be used as the λ/4 wave plate (X).

The λ/4 wave plate (X) may include a substrate in addition to the resin film (X). Specifically, a laminate of the substrate and the liquid crystal resin film may be used as the λ/4 wave plate (X) without separation of the liquid crystal resin film formed on the substrate film from the substrate. When as the substrate, a preferable material such as the alicyclic structure-containing polymer or the cellulose ester is selected, the optical anisotropy may be decreased while high orientation-controlling force imparted by stretching is held. Therefore, a laminate having such a substrate as it is may be used as the λ/4 wave plate (X).

The λ/4 wave plate (X) may have another optional layer, if necessary. Examples of the optional layer may include an adhesion layer for adhesion to another member, a mat layer for improving the sliding property of the film, a hard-coat layer such as an impact-resistant polymethacrylate resin layer, an anti-reflection layer, and an anti-fouling layer.

[7. Circular Polarizing Plate (X)]

The λ/4 wave plate (X) is preferably used as a component of a circular polarizing plate (X) described below.

The circular polarizing plate (X) is provided with the λ/4 wave plate (X). The circular polarizing plate (X) may have a linear polarizer in addition to the λ/4 wave plate (X).

As the linear polarizer, any known polarizers used in a device such as a liquid crystal display device may be used. Examples of the linear polarizer may include a linear polarizer obtained by effecting adsorption of iodine or dichroic dye to a polyvinyl alcohol film, and uniaxially stretching the film in a boric acid bath, and a linear polarizer obtained by effecting adsorption of iodine or dichroic dye to a polyvinyl alcohol film, stretching the film, and modifying one moiety of polyvinyl alcohol unit in the molecular chain into a polyvinylene unit. Other examples of the linear polarizer may include a polarizer having a function of separating light into polarized reflected light and transmitted light, such as a grid polarizer, a multi-layer polarizer, and a cholesteric liquid crystal polarizer. Among these, a polarizer containing polyvinyl alcohol is preferred.

When natural light reaches the circular polarizing plate, only one polarized light passes therethrough. The polarization degree of the polarizer used for the circular polarizing plate (X) is not particularly limited, and is preferably 98% or more, and more preferably 99% or more. The average thickness of the polarizer is preferably 5 to 80 µm.

When the λ/4 wave plate (X) is used for the circular polarizing plate (X), it is preferable that the phase difference at a wavelength of 550 nm is 137.5 nm or a value close to 137.5 nm, specifically 100 to 150 nm. In the circular polarizing plate (X), it is preferable that the angle formed between a slow axis of the λ/4 wave plate (X) and a transmission axis of the linear polarizer is 45° or an angle close to 45°, specifically 40 to 50°. When the circular polarizing plate has such a phase difference and such an angle, the circular polarizing plate may be usefully used for an application such as a component of the liquid crystal display device.

One of applications of the circular polarizing plate having such a configuration may be an application as an anti-reflective film for a display device having an organic EL element. Specifically, the circular polarizing plate (X) having the aforementioned configuration is provided on a surface of the display device so that a face on a linear polarizer side is disposed toward a visual observation side. This can suppress radiation of light that has entered from the outside of the display device and then been reflected within the display device to the outside of the display device. As a result, undesired phenomena in light such as glare on a display face of the display device can be suppressed. Specifically, among the light that has entered from the outside of the device, only a part of linearly polarized light passes through the linear polarizer, and then passes through the λ/4 wave plate, resulting in circularly polarized light. The circularly polarized light herein includes elliptically polarized light as long as an anti-reflection function is substantially expressed. The circularly polarized light is reflected on a component that reflects light in the display device (reflection electrode in the organic EL element, etc.), and then passes through the λ/4 wave plate again, resulting in linearly polarized light having a polarization axis in a direction orthogonal to the polarization axis of the linear polarizer having entered. Thus, the light does not pass through the liner polarizer. The anti-reflection function can thereby be achieved.

The circular polarizing plate (X) may have an optional component such as those which the component of the λ/4 wave plate (X) may have.

[8. Display Device (X)]

The λ/4 wave plate (X) and the circular polarizing plate (X) may be used as a component of a display device such as a liquid crystal display and an organic EL display device. Examples of particularly preferable aspect may include an organic EL display device having the circular polarizing plate (X). Specifically, the organic EL display device (X) is a display device having an organic EL element as a display element in which the circular polarizing plate (X) may be provided as the anti-reflective film, as described above.

The resin film (X) may be used for a material for a phase difference plate such as the λ/4 wave plate (X). The resin film (X) is capable of uniformly expressing phase difference in the plane, can be efficiently manufactured, and has a reduced number of defects due to generation of a heterogeneous matter. According to the method (X), the resin film (X) may be efficiently manufactured.

In particular, when a substrate having a birefringence Δn of 0.000050 or more is used, particularly favorable orientation-controlling force can be expressed. Further, when the resin film (X) having inverse wavelength distribution is formed using the polymerizable liquid crystal compound having inverse wavelength distribution as a material for the cured liquid-crystal molecules, the resin film (X) that has high manufacturing efficiency by diagonal stretching, high degree of design freedom of slow axis direction, uniform properties in the plane, a reduced number of defects due to a heterogeneous matter, and high-level of usefulness due to inverse wavelength distribution, all of which are at high levels, can be provided.

The λ/4 wave plate (X), the circular polarizing plate (X), and the organic EL display device (X) are a λ/4 wave plate, a circular polarizing plate, and an organic electroluminescent display device, respectively, that have uniform properties, can be efficiently manufactured, and have a reduced number of defects due to generation of a heterogeneous matter.

EXAMPLES

Hereinafter, the present invention will be specifically described with reference to Examples. However, the present invention is not limited to Examples described below. The present invention may be implemented with any modifications without departing from the scope of claims of the present invention and equivalents thereof.

Unless otherwise specified, "%" and "part(s)" that represent an amount in the following description are based on weight. Unless otherwise specified, operations described below were performed under conditions of normal temperature and normal pressure.

Hereinafter, Examples 1 to 12 and Comparative Example 1 will first be described, and Reference Examples 1 to 6 and Reference Comparative Example 1 will then be described.

Measurement Methods in Examples 1 to 12 and Comparative Example 1

[1. Method for Measuring in-Plane Retardation and Slow Axis Direction]

The in-plane retardation and the slow axis direction of the first substrate and the optically anisotropic layer were measured at a measurement wavelength of 550 nm by AxoScan (manufactured by Axometrics, Inc.). The in-plane retardation and the slow axis direction of the optically anisotropic layer were measured in a sample obtained by transferring the optically anisotropic layer to a glass plate.

[2. Method for Evaluating Orientation State]

A sample was prepared by transferring the optically anisotropic layer to a glass plate. The sample was disposed between two linear polarizers (polarizer and analyzer). At that time, the polarizers were disposed so that polarized light transmission axes of the polarizers were orthogonal to each other as viewed in a thickness direction. The slow axis direction of the optically anisotropic layer was set so as to be parallel or orthogonal to the polarized light transmission axes of the linear polarizers as viewed in the thickness direction. A transmittance of light through this sample (transmittance under crossed Nicols) was measured by a spectrophotometer "V7200" and an automated polarizing film measurement device "VAP-7070S" manufactured by JASCO Corporation, and evaluated in accordance with the following criteria.

Excellent: the transmittance under crossed Nicols at the bottom wavelength was 0.010% or less.

Good: the transmittance under crossed Nicols at the bottom wavelength was more than 0.010% and 0.020% or less.

Passable: the transmittance under crossed Nicols at the bottom wavelength was more than 0.020% and 0.030% or less.

Bad: the transmittance under crossed Nicols at the bottom wavelength was more than 0.030%.

[3. Method for Evaluating Orientation Defects]

The liquid crystal resin layer was observed by a polarized light microscope, and evaluated by the presence or absence of line defects in the liquid crystal resin layer in accordance with the following criteria. Herein, the line defects represent linearly extending defects of orientation as shown in FIG. 1.

Good: line defects did not exist.

Bad: line defects existed.

[4. Method for Evaluating Bright Spot and Heterogeneous Matter]

The optically anisotropic layer was observed by a polarized light microscope, and visually evaluated by the presence or absence of a bright spot and a heterogeneous matter in the optically anisotropic layer.

Good: the number of bright spots and heterogeneous matters per square meter is 5 or less.

Bad: the number of bright spots and heterogeneous matters per square meter is 6 or more.

[5. Visual Observation of Circular Polarizing Plate]

The circular polarizing plate was disposed on a diffuse reflection plate (product name: "Metalumy TS50" available from Toray Industries, Inc., aluminum-deposited polyethylene terephthalate (PET) film), and the front contrast and viewing angle characteristics were evaluated in accordance with the following criteria.

The front contrast was visually observed from the front (that is, in a direction perpendicular to a face of the circular polarizing plate) and evaluated on the basis of observed reflection color. A case where the reflection color was particularly black was evaluated "A" (excellent). A case where the reflection color was black was evaluated "B" (good). A case where the reflection color was bright and blue was evaluated "C" (bad).

The viewing angle characteristics were visually observed from the front and at an angle of 45° and evaluated on the basis of reflection color, brightness, and color unevenness.

A case where the reflection color and the brightness observed from the front were not different from those observed at an angle of 45° and the color unevenness was not recognized in the observation at an angle of 45° was evaluated as "A" (excellent).

A case where the reflection color and the brightness observed from the front were not different from those observed at an angle of 45° and the color unevenness was not almost recognized in the observation at an angle of 45° was evaluated as "B" (good).

A case where the reflection color and the brightness observed from the front were different from those observed at an angle of 45° and the color unevenness was slightly recognized in the observation at an angle of 45° was evaluated as "C" (usable but not good).

A case where the reflection color and the brightness observed from the front were different from those observed at an angle of 45° and the color unevenness was clearly recognized in the observation at an angle of 45° was evaluated as "D" (bad).

Production Example 1: Preparation of Pre-Stretch Substrate (A)

Pellets of thermoplastic norbornene resin (product name "ZEONOR1420R" available from ZEON CORPORATION, Tg: 137° C.) were dried at 90° C. for 5 hours. The dried pellets were supplied to an extruder, melted in the extruder, passed through a polymer pipe and a polymer filter, and extruded from a T-die on a casting drum to be in a sheet shape. The sheet was cooled, and wound while the sheet was protected with a masking film (FF1025 available from Tredegar Corporation). As a result, a roll of pre-stretch substrate (A) having a thickness of 80 μm and a width of 1,490 mm was obtained.

Production Example 2: Preparation of Pre-Stretch Substrate (B)

A roll of pre-stretch substrate (B) having a thickness of 50 μm and a width of 675 mm was obtained in the same manner as in Production Example 1 except that a T-die was changed.

Production Example 3: Preparation of Pre-Stretch Substrate (C)

A roll of pre-stretch substrate (C) having a thickness of 80 μm and a width of 1,490 mm was obtained in the same manner as in Production Example 1 except that the pellet of thermoplastic norbornene resin were changed to pellets of another norbornene resin (available from ZEON CORPORATION, Tg: 126° C.)

Production Example 4: Preparation of Liquid Crystal Composition (A)

24.15 parts of a polymerizable liquid crystal compound (product name "LC242" available from BASF, a compound represented by a formula (A1)), 0.12 parts of a surfactant (product name "FTERGENT FTX-209F" available from Neos Company Limited), 0.73 parts by weight of a polymerization initiator (product name "IRGACURE379" available from BASF), and 75.00 parts of a solvent (methyl ethyl ketone) were mixed to prepare a liquid crystal composition.

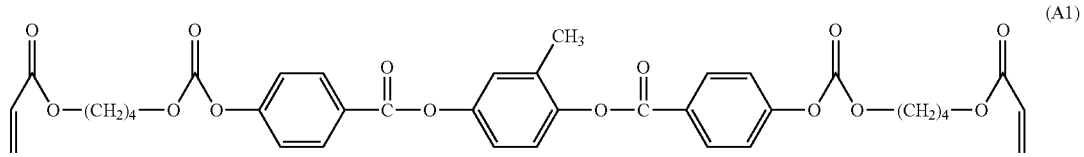

(A1)

Production Example 5: Preparation of Liquid Crystal Composition (B)

21.25 parts of a polymerizable liquid crystal compound having inverse wavelength distribution represented by a formula (B1), 0.11 parts of a surfactant (product name "Surflon 5420" available from AGC Seimi Chemical Co., Ltd.), 0.64 parts of a polymerization initiator (product name "IRGACURE379" available from BASF), and 78.00 parts of a solvent (cyclopentanone available from ZEON CORPORATION) were mixed to prepare a liquid crystal composition.

(B1)

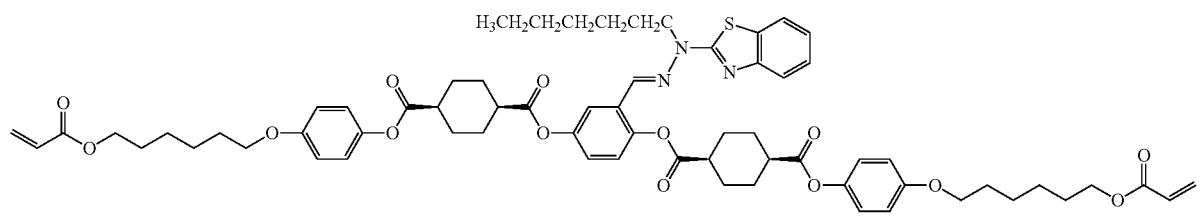

Example 1

(1-1. Preparation of First Substrate)

The pre-stretch substrate (A) was drawn from the roll of pre-stretch substrate (A) obtained in Production Example 1, the masking film was continuously separated, and the pre-stretch substrate was supplied to a tenter stretching machine. The pre-stretch substrate was diagonally stretched such that slow axis of the substrate film is formed at an angle of 15° relative to the widthwise direction (75° relative to the lengthwise direction), and both ends of the substrate in the widthwise direction of the substrate film were trimmed. Thus, a long-length first substrate (A-1) having a width of 1,350 mm was obtained. The Re of the obtained first substrate (A-1) was 265 nm and the film thickness thereof was 40 μm. The obtained first substrate (A-1) was wound while the first substrate was protected with a new masking film (FF1025 available from Tredegar Corporation). Thus, a roll of the first substrate (A-1) was obtained. The value of Δn calculated by (Re(nm))/(film thickness (μm)×1,000) was 0.006625.

(1-2. Formation of Layer of Liquid Crystal Composition)

The first substrate (A-1) was fed out from the roll of the first substrate (A-1) obtained in (1-1), the masking film was separated, and the first substrate was conveyed. The liquid crystal composition (A) obtained in Production Example 4 was directly applied onto one face of the conveyed first substrate (A-1) (face on a side that had been attached to the masking film) by a die coater at a room temperature of 25° C. to form a layer of the liquid crystal composition.

(1-3. Orientation Treatment and Polymerization)

The layer of the liquid crystal composition on the first substrate (A-1), obtained in (1-2), was subjected to an orientation treatment at 110° C. for 2.5 minutes. The layer of the liquid crystal composition was then irradiated with ultraviolet light having an integrated illuminance of 100 mJ/cm² (irradiation intensity of 10 mW/cm² for an irradiation time of 10 seconds) or more under a nitrogen atmosphere to polymerize the polymerizable liquid crystal compound in the liquid crystal composition. Thus, cured liquid-crystal molecules were formed. As a result, a homogeneously oriented optically anisotropic layer having a dried thickness of 1.1 μm was obtained, and a multilayer film having a layer structure of (first substrate)/(optically anisotropic layer) was obtained.

(1-4. Evaluation)

For the optically anisotropic layer of the obtained multilayer film, the in-plane retardation and the angle formed between the slow axis and the lengthwise direction were measured, and the orientation state, the orientation defects, as well as a bright spot and a heterogeneous matter were evaluated.

Example 2

A first substrate and a multilayer film were obtained by the same operation as in Example 1 except for the following:
The thickness of the liquid crystal composition to be applied in (1-2) was changed and the dried thickness of the optically anisotropic layer obtained in (1-3) was changed to 2.0 μm.

Example 3

A first substrate and a multilayer film were obtained by the same operation as in Example 1 except for the following:
The stretching direction in (1-1) was changed to perform diagonal stretching such that the slow axis of the substrate film is formed at an angle of 22.5° relative to the widthwise direction (67.5° relative to the lengthwise direction).
The liquid crystal composition (B) obtained in Production Example 5 was used in place of the liquid crystal composition (A) in (1-2); the temperature of the orientation treatment was changed to 115° C.
The thickness of the liquid crystal composition to be applied in (1-2) was changed and the dried thickness of the optically anisotropic layer obtained in (1-3) was changed to 2.2 μm.

Example 4

A first substrate and a multilayer film were obtained by the same operation as in Example 1 except for the following:
The stretching direction in (1-1) was changed to perform diagonal stretching such that the slow axis of the substrate film is formed at an angle of 45° relative to the widthwise direction (45° relative to the lengthwise direction).

Example 5

A first substrate and a multilayer film were obtained by the same operation as in Example 1 except for the following:
The stretching direction in (1-1) was changed to perform diagonal stretching such that the slow axis of the substrate film is formed at an angle of 45° relative to the widthwise direction (45° relative to the lengthwise direction).
The liquid crystal composition (B) obtained in Production Example 5 was used in place of the liquid crystal composition (A) in (1-2); the temperature of the orientation treatment was changed to 115° C.
The thickness of the liquid crystal composition to be applied in (1-2) was changed and the dried thickness of the optically anisotropic layer obtained in (1-3) was changed to 2.1 μm.

Example 6

A first substrate and a multilayer film were obtained by the same operation as in Example 1 except for the following:

The pre-stretch substrate (C) obtained in Production Example 3 was used in place of the liquid crystal composition (A) in (1-1).

The stretching direction in (1-1) was changed to perform diagonal stretching such that the slow axis of the substrate film is formed at an angle of 45° relative to the widthwise direction (45° relative to the lengthwise direction).

The liquid crystal composition (B) obtained in Production Example 5 was used in place of the liquid crystal composition (A) in (1-2); the temperature of the orientation treatment was changed to 115° C.

The thickness of the liquid crystal composition to be applied in (1-2) was changed and the dried thickness of the optically anisotropic layer obtained in (1-3) was changed to 2.2 μm.

Example 7

A first substrate and a multilayer film were obtained by the same operation as in Example 1 except for the following:

The pre-stretch substrate (B) obtained in Production Example 2 was used in place of the liquid crystal composition (A) in (1-1).

The stretching direction in (1-1) was changed to perform widthwise stretching such that the slow axis of the substrate film is formed at an angle of 0° relative to the widthwise direction (90° relative to the lengthwise direction).

Example 8

A first substrate and a multilayer film were obtained by the same operation as in Example 1 except for the following:

A long-length triacetylcellulose (TAC) film (available from Konica Minolta, Inc., thickness: 80 μm, width: 1,490 mm, glass transition temperature: 107° C.) was used in place of the pre-stretch substrate (A) in (1-1).

The stretching direction in (1-1) was changed to perform diagonal stretching such that the slow axis of the substrate film is formed at an angle of 45° relative to the widthwise direction (45° relative to the lengthwise direction).

The temperature of the orientation treatment was decreased to 90° C. in (1-2) to avoid deformation of the TAC film.

Comparative Example 1

(C1-1. Preparation of Substrate having Orientation-Controlling Force)

The pre-stretch substrate (A) was drawn from the roll of the pre-stretch substrate (A) obtained in Production Example 1, the masking film was continuously separated, and the pre-stretch substrate (A) was supplied to a diagonal rubbing device, and rubbed in a diagonal direction. The rubbing direction was adjusted to an angle of the substrate film of 45° relative to the widthwise direction (45° relative to the lengthwise direction).

After the rubbing treatment, both ends of the substrate film in the widthwise direction of the substrate film were trimmed to obtain a long-length substrate (A-3) having a width of 1,350 mm and an orientation-controlling force. The Re of the obtained substrate (A-3) was 5 nm and the film thickness thereof was 80 μm. The obtained substrate (A-3) was wound while a rubbed face was protected with a new masking film (FF1025 available from Tredegar Corporation). Thus, a roll of the substrate (A-3) was obtained.

(C1-2. Formation of Layer of Liquid Crystal Composition, Orientation Treatment, Polymerization, and Evaluation)

A multilayer film was obtained and evaluated in the same manner as in (1-2) to (1-4) of Example 1 except that the substrate (A-3) obtained in (C1-1) was used in place of the first substrate (A-1).

The results in Examples 1 to 10 and Comparative Example 1 are shown in Tables 1 and 2.

TABLE 1

|  | Ex. 1 | Ex. 2 | Ex. 3 | Ex. 4 | Ex. 5 | Ex. 6 |
|---|---|---|---|---|---|---|
| Substrate type | (A) | (A) | (A) | (A) | (A) | (C) |
| Substrate stretch | Diagonal | Diagonal | Diagonal | Diagonal | Diagonal | Diagonal |
| Substrate slow axis direction | 15° | 15° | 22.5° | 45° | 45° | 45° |
| Substrate Re (nm) | 265 | 265 | 325 | 70 | 70 | 141 |
| Substrate thickness (μm) | 40 | 40 | 75 | 75 | 75 | 60 |
| Substrate Δn | 0.006625 | 0.006625 | 0.004333 | 0.000933 | 0.000933 | 0.002350 |
| Liquid crystal type | A | A | B | A | B | B |
| Orientation temperature (° C.) | 110 | 110 | 115 | 110 | 115 | 115 |
| Anisotropic layer Re (nm) | 145 | 270 | 148 | 145 | 147 | 148 |
| Anisotropic layer thickness (μm) | 1.1 | 2.0 | 2.2 | 1.1 | 2.1 | 2.2 |
| Angle between anisotropic layer slow axis and lengthwise direction | 75° | 75° | 67.5° | 45° | 45° | 45° |

TABLE 1-continued

|  | Ex. 1 | Ex. 2 | Ex. 3 | Ex. 4 | Ex. 5 | Ex. 6 |
|---|---|---|---|---|---|---|
| Orientation state | Excellent | Excellent | Good | Excellent | Good | Good |
| Orientation defects | Good | Good | Good | Good | Good | Good |
| Bright spot and heterogeneous matter | Good | Good | Good | Good | Good | Good |

TABLE 2

|  | Ex. 7 | Ex. 8 | Comp. Ex. 1 |
|---|---|---|---|
| Substrate type | (B) | TAC | (A) |
| Substrate stretch | Widthwise | Diagonal | No stretching (rubbing) |
| Substrate slow axis direction | 0° | 45° | 45 |
| Substrate Re(nm) | 120 | 14 | 5 |
| Substrate thickness(μm) | 40 | 79 | 80 |
| Substrate Δn | 0.003000 | 0.0001770 | — |
| Liquid crystal type | A | A | A |
| Orientation temperature (° C.) | 110 | 90 | 110 |
| Anisotropic layer Re (nm) | 144 | 145 | 142 |
| Anisotropic layer thickness (μm) | 1.1 | 1.1 | 1.1 |
| Angle between anisotropic layer slow axis and lengthwise direction | 90° | 45° | 45° |
| Orientation state | Good | Good | Good |
| Orientation defects | Good | Good | Good |
| Bright spot and heterogeneous matter | Good | Good | Bad (heterogeneous) |

Example 9

(9-1. Manufacturing of Circular Polarizing Plate)

A circular polarizing plate was manufactured using the optically anisotropic layer of the multilayer film obtained in Example 6 as a λ/4 wave plate.

As a long-length linear polarizer, a polarizing film (product name "HLC2-5618S" available from Sanritz Corporation, thickness: 180 μm, transmission axis at an angle of 90° relative to the lengthwise direction (at an angle of 0° relative to the widthwise direction) was prepared. One face of the film was attached to one face of the multilayer film obtained in Example 6 on a side of the optically anisotropic layer (that is, the λ/4 wave plate). The attachment was performed through an adhesive layer (product name "CS9621" available from Nitto Denko Corporation). Thus, a laminate (9-i) having a layer structure of (polarizer)/(adhesive layer)/(λ/4 wave plate)/(first substrate) was obtained.

The first substrate was then separated from the laminate (9-i) to obtain a circular polarizing plate having a layer structure of (polarizer)/(adhesive layer)/(λ/4 wave plate).

Both the attachment and separation operations were continuously performed by a roll-to-roll process. Therefore, the attachment operation was performed in a state where the lengthwise directions of the long-length films were aligned.

The optical axes of the components of the obtained circular polarizing plate had the following angle relationship. That is, when the circular polarizing plate was observed from a face on a side of the polarizer, the slow axis of the λ/4 wave plate was shifted clockwise at 45° from the direction of transmission axis of the polarizing plate.

(9-2. Evaluation)

The long-length circular polarizing plate obtained in (9-1) was cut into an appropriate size, and evaluated by visual observation.

Further, the face of the circular polarizing plate on the side of the λ/4 wave plate was attached to a reflection face of a reflection plate (product name: "Metalumy TS50" available from Toray Industries, Inc., aluminum-deposited polyethylene terephthalate (PET) film). The attachment was performed through an adhesive layer (product name "CS9621" available from Nitto Denko Corporation). Thus, a laminate (9-v) for evaluation having a layer structure of (polarizer)/(adhesive layer)/(λ/4 wave plate)/(adhesive layer)/(reflection plate) was obtained.

Figure 2:
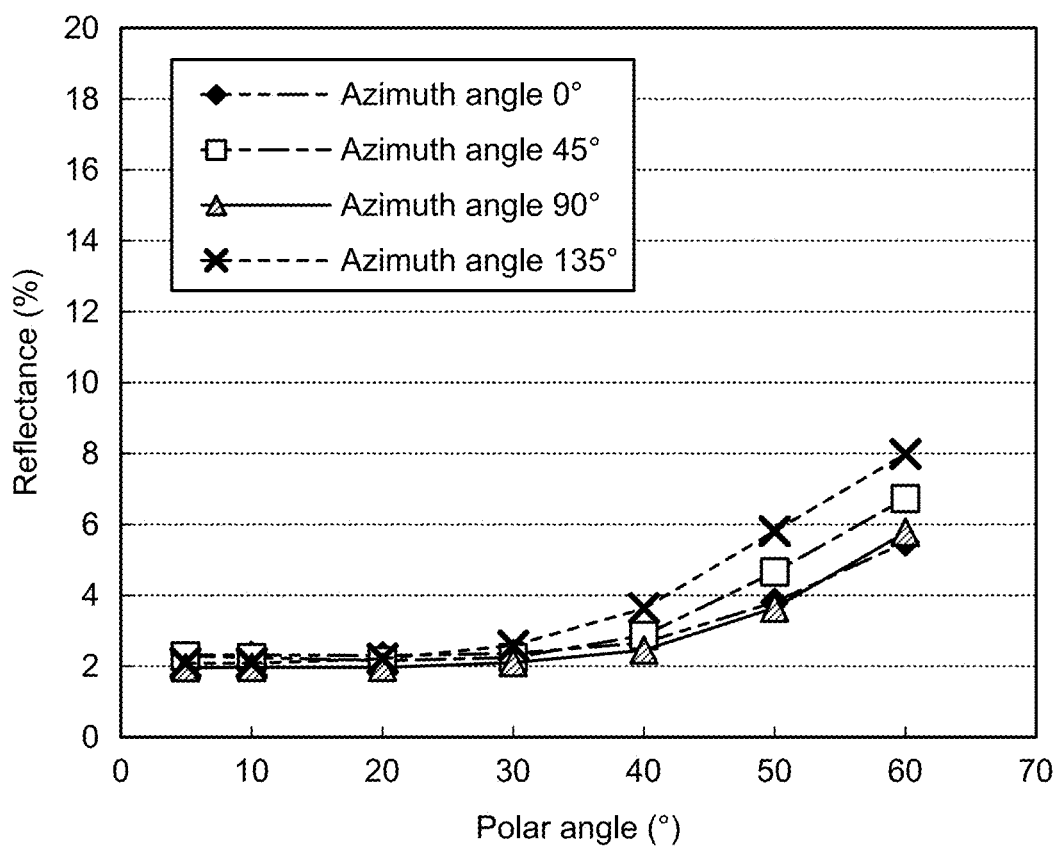
FIG. 2 is a graph showing results of measurement of reflectance of light incident on a surface on a polarizer side of a laminate for evaluation of a circular polarizing plate and calculation of reflection brightness from the measured reflectance.

For the obtained laminate (9-v) for evaluation, the reflectance of light incident on the face on the polarizer side was measured. In the measurement, a spectrophotometer V7200 and an absolute reflectance unit VRA7020 (manufactured by JASCO Corporation) were used. In the measurement, the polar angle was variously changed within a range of 5° to 60°. When the circular polarizing plate was observed from the face on the polarizer side, an azimuth angle was set to an angle of 0°, 45°, 90°, and 135° clockwise from the direction of transmission axis of the polarizing plate. The results are shown in FIG. 2.

Examples 10 to 12

A circular polarizing plate was obtained by the same operation as in (9-1) of Example 9 except that the multilayer film obtained in Example 4 (Example 10), the multilayer film obtained in Example 5 (Example 11), or the multilayer film obtained in Example 8 (Example 12) was used in place of the multilayer film obtained in Example 6.

The angle relationship of optical axes of the components of the obtained circular polarizing plate was the same as that of the circular polarizing plate obtained in Example 9.

The long-length circular polarizing plate obtained was cut into an appropriate size, and evaluated by visual observation.

The evaluation results by visual observation in Examples 9 to 12 are shown in Table 3.

TABLE 3

|  | Ex. 9 | Ex. 10 | Ex. 11 | Ex. 12 |
|---|---|---|---|---|
| Example manufacturing optically anisotropic layer used | Ex. 6 | Ex. 4 | Ex. 5 | Ex. 8 |
| Front contrast | A | B | A | B |
| Viewing angle characteristics | B | B | B | B |

As clearly shown from the results of Tables 1 to 3, in Examples of the present application, a multilayer film having a reduced number of defects due to generation of a heterogeneous matter was successfully manufactured, and a circular polarizing plate having favorable performance was successfully manufactured using the multilayer film.

Measurement Methods in Reference Examples 1 to 6 and Reference Comparative Example 1

[1. Shift Between Orientation Direction of Liquid Crystal Resin Film and Slow Axis Direction of Substrate]

Before the liquid crystal composition was applied onto the substrate, a reference line was drawn on a face of the substrate opposite to a face onto which the liquid crystal composition was applied. A layer of liquid crystal resin film was formed, and a reference line was then drawn on a face of the liquid crystal resin film at a position that corresponded to a reference plane of the substrate. After that, the liquid crystal resin film was transferred to a glass plate through an adhesive, and separated from the substrate. The slow axis direction of the substrate and the orientation direction of the liquid crystal resin film were each measured by AxoScan (manufactured by Axometrics, Inc.). The angle formed between the slow axis of the substrate and the reference line on the substrate, and the angle formed between the orientation direction of the liquid crystal resin film and the reference line on the liquid crystal resin film were determined. From the angles, a shift between the orientation direction of the liquid crystal resin film and the slow axis direction of the substrate was determined.

[2. Orientation Degree of Liquid Crystal Resin Film]

The liquid crystal resin film transferred to a glass plate was disposed between a polarizer and an analyzer, and the transmittance under crossed Nicols was measured by V7200 and VAP-7070S manufactured by JASCO Corporation, and evaluated in accordance with the following criteria.

Excellent: the transmittance under crossed Nicols at the bottom wavelength was 0.010% or less.

Good: the transmittance under crossed Nicols at the bottom wavelength was more than 0.010% and 0.020% or less.

Passable: the transmittance under crossed Nicols at the bottom wavelength was more than 0.020% and 0.030% or less.

[3. Amount of Heterogeneous Matter]

The liquid crystal resin film was visually observed, and the amount of heterogeneous matters per square meter was counted, and evaluated in accordance with the following criteria.

Good: the number of heterogeneous matters per square meter was 5 or less.

Bad: the number of heterogeneous matters per square meter was 6 or more.

Reference Example 1

(Step (1-1): Preparation of Pre-Stretch Substrate of Resin Having Alicyclic Structure)

Pellets of a thermoplastic norbornene resin (product name "ZEONOR1420R" available from ZEON CORPORATION) were dried at 90° C. for 5 hours. The dried pellets were supplied to an extruder, melted in the extruder, passed through a polymer pipe and a polymer filter, and extruded from a T-die on a casting drum to be in a sheet shape. The sheet was cooled, and wound to obtain a roll of pre-stretch substrate having a thickness of 80 μm and a width of 1,490 mm.

(Step (1-2): Preparation of Stretched Substrate of Resin Having Alicyclic Structure)

The pre-stretch substrate obtained in (1-1) was drawn from the roll, supplied to a tenter stretching machine, and stretched such that the orientation angle of the film is set at 45° relative to the winding direction of the film. Both ends in the widthwise direction of the film were trimmed, and the film was wound to obtain a roll of long-length stretched substrate having a width of 1,350 mm. The Re of the resulting stretched substrate was 69.3 nm and the film thickness was 75 μm. The value of Δn calculated by (Re (nm))/(film thickness (μm)×1,000) was 0.000923.

(Step (1-3): Preparation of Liquid Crystal Composition)

21.25 parts of a polymerizable liquid crystal compound having inverse wavelength distribution represented by a formula (B1) of Production Example 5, 0.11 parts of a surfactant (product name "Surflon 5420" available from AGC Seimi Chemical Co., Ltd.), 0.64 parts of a polymerization initiator (product name "IRGACURE379" available from BASF), and 78.00 parts of a solvent (cyclopentanone available from ZEON CORPORATION) were mixed to prepare a liquid crystal composition.

(Step (1-4): Formation of Liquid Crystal Resin Film)

The stretched substrate prepared in Step (1-2) was drawn from the roll, and conveyed, and the liquid crystal composition prepared in Step (1-3) was applied onto one surface of the substrate by a die coater to form a layer of the liquid crystal composition. The layer of the liquid crystal composition was subjected to an orientation treatment at 110° C. for 2.5 minutes, and irradiated with ultraviolet light having 100 mJ/cm$^2$ or more under an N$_2$ atmosphere, to obtain a layer of a liquid crystal resin film having a dried thickness of 2 μm and containing cured liquid-crystal molecules homogeneously oriented. For confirmation of homogeneous orientation, AxoScan (manufactured by Axometrics, Inc.) was used. The slow axis direction of the liquid crystal resin film layer was measured, and Re's in various incidence angles in the slow axis direction at every 10° within a range of incidence angle of −70° to 70° were measured. A measurement wavelength of 550 nm was used. When Re at a negative incidence angle and Re at a positive incidence angle are approximately symmetric about an incidence angle of 0° as the center, it can be said that homogeneous orientation is achieved. Re's of the obtained liquid crystal resin film at every incidence angle had a symmetry about 0° as the center, and homogeneous orientation was thus confirmed.

(Step (1-5): Evaluation)

The shift between the orientation direction of the liquid crystal resin film obtained in Step (1-4) and the slow axis direction of the substrate was less than 1°. The orientation degree of the obtained liquid crystal resin film and the amount of a heterogeneous matter were evaluated. The results are shown in Table 5.

Reference Examples 2 and 3

A stretched substrate, a liquid crystal composition, and a liquid crystal resin film were obtained and evaluated in the same manner as in Reference Example 1 except that the types and ratios of components constituting the liquid crystal composition were changed as shown in Table 4, the conditions for stretching an pre-stretch substrate was changed, and a stretched substrate having a different value Δn was used. The results are shown in Table 5. In all Reference Examples, the shift between the orientation direction of the liquid crystal resin film and the slow axis direction of the substrate was less than 1°.

Reference Example 4

(Step (4-1): Preparation of Triacetylcellulose Stretched Substrate)

A roll of a long-length triacetylcellulose film (available from Konica Minolta, Inc., thickness: 80 μm, width: 1,490 mm) was prepared as an pre-stretch substrate. The pre-stretch substrate was drawn from the roll, supplied to a tenter stretching machine, and stretched at a stretching temperature of 155° C. and a stretching ratio of 1.01, such that the orientation angle of the film is set at 45° relative to the winding direction. Both ends in the widthwise direction of the film were trimmed, and the film was wound to obtain a roll of long-length stretched substrate having a width of 1,350 mm. The Re of the resulting stretched substrate was 14 nm and the film thickness was 79 μm. The value of Δn calculated by (Re(nm))/(film thickness (μm)×1,000) was 0.000078.

(Step (4-2): Preparation of Liquid Crystal Composition)

24.15 parts of a polymerizable liquid crystal compound (product name "LC242" available from BASF, a compound represented by a formula (A1) in Production Example 4), 0.12 parts of a surfactant (product name "FTERGENT FTX-209F" available from Neos Company Limited), 0.73 parts of a polymerization initiator (product name "IRGACURE379" available from BASF), and 75.00 parts of a solvent (cyclopentyl methyl ether available from ZEON CORPORATION) were mixed to prepare a liquid crystal composition.

(Step (4-3): Formation of Liquid Crystal Resin Film)

The stretched substrate prepared in Step (4-1) was drawn from the roll, and conveyed, and the liquid crystal composition prepared in Step (4-2) was applied onto one surface of the substrate by a die coater to form a layer of the liquid crystal composition. The layer of the liquid crystal composition was subjected to an orientation treatment at 110° C. for 2.5 minutes, and irradiated with ultraviolet light having 100 mJ/cm² or more under an N₂ atmosphere, to obtain a layer of a liquid crystal resin film having a dried thickness of 2 μm and being homogeneously oriented. The homogeneous orientation was confirmed by the same method as the confirmation method in Step (1-4) of Reference Example 1.

(Step (4-4): Evaluation)

The shift between the orientation direction of the liquid crystal resin film obtained in Step (4-3) and the slow axis direction of the substrate was less than 1°. The orientation degree of the obtained liquid crystal resin film and the amount of a heterogeneous matter were evaluated. The results are shown in Table 5.

Reference Examples 5 and 6

A stretched substrate, a liquid crystal composition, and a liquid crystal resin film were obtained and evaluated in the same manner as in Reference Example 4 except that the types and ratios of components constituting the liquid crystal composition were changed as shown in Table 4, and the conditions for stretching an pre-stretch substrate was changed as shown in Table 5. The results are shown in Table 5. In both Reference Examples, the shift between the orientation direction of the liquid crystal resin film and the slow axis direction of the substrate was less than 1°.

Reference Comparative Examples 1

The pre-stretch substrate obtained in Step (1-1) of Reference Example 1 was drawn from the roll, and rubbed in an MD direction. The liquid crystal composition having the same composition as that used in Reference Example 2 was applied onto one surface of the substrate by a die coater to form a layer of the liquid crystal composition. The layer of the liquid crystal composition was subjected to an orientation treatment at 110° C. for 2.5 minutes, and irradiated with ultraviolet light having 100 mJ/cm² or more under an N₂ atmosphere, to obtain a layer of a liquid crystal resin film having a dried thickness of 2 μm and being homogeneously oriented. The homogeneous orientation was confirmed by the same method as the confirmation method in Step (1-4) of Reference Example 1. The shift between the orientation direction of the obtained liquid crystal resin film and the slow axis direction of the substrate was less than 1°. The orientation degree of the obtained liquid crystal resin film and the amount of a heterogeneous matter were evaluated. The results are shown in Table 5.

TABLE 4

| | Ref. Ex. 1 | Ref. Ex. 2 | Ref. Ex. 3 | Ref. Ex. 4 | Ref. Ex. 5 | Ref. Ex. 6 | Ref. Comp. Ex. 1 |
|---|---|---|---|---|---|---|---|
| Liquid crystal compound | Inverse wavelength | LC242 | Inverse wavelength | LC242 | LC242 | Inverse wavelength | LC242 |
| Amount (parts) | 21.25 | 24.15 | 21.25 | 24.15 | 24.15 | 21.25 | 24.15 |
| Surfactant | S420 | 209F | S420 | 209F | 209F | S420 | 209F |
| Amount (parts) | 0.11 | 0.12 | 0.11 | 0.12 | 0.12 | 0.11 | 0.12 |
| Polymerization initiator | Irg379 | Irg379 | Irg379 | Irg379 | Irg379 | Irg379 | Irg379 |
| Amount (parts) | 0.64 | 0.73 | 0.64 | 0.73 | 0.73 | 0.64 | 0.73 |
| Solvent | CPN | CPN | CPN | CPME | CPME | CPME | CPN |
| Amount (parts) | 78.00 | 75.00 | 78.00 | 75.00 | 75.00 | 78.00 | 75.00 |

TABLE 5

|  | Substrate | Orientation control method | Slow axis direction (°) | Δn | Liquid crystal material | Substrate Re (nm) | Substrate thickness (μm) | Orientation state | Orientation degree | Heterogeneous matter amount |
|---|---|---|---|---|---|---|---|---|---|---|
| Ref. Ex. 1 | COP | Diagonal | 45 | 0.000923 | Inverse wavelength | 69.3 | 75 | Homogeneous | Good | Good |
| Ref. Ex. 2 | COP | Diagonal | 45 | 0.001607 | LC242 | 91.6 | 57 | Homogeneous | Excellent | Good |
| Ref. Ex. 3 | COP | Diagonal | 22.5 | 0.006397 | Inverse wavelength | 280 | 44 | Homogeneous | Excellent | Good |
| Ref. Ex. 4 | TAC | Diagonal | 45 | 0.000078 | LC242 | 14 | 79 | Homogeneous | Passable | Good |
| Ref. Ex. 5 | TAC | Diagonal | 45 | 0.000124 | LC242 | 6 | 77 | Homogeneous | Good | Good |
| Ref. Ex. 6 | TAC | Diagonal | 45 | 0.000175 | Inverse wavelength | 9.3 | 75 | Homogeneous | Good | Good |
| Ref. Comp. Ex. 1 | COP | Rubbing | (MD) | — | LC242 | — | — | Homogeneous | Good | Bad |

Meanings of the abbreviations in Tables 4 and 5 are as follows.

Inverse wavelength: polymerizable liquid crystal compound having inverse wavelength distribution represented by the aforementioned formula (B1)

LC242: polymerizable liquid crystal compound (product name "LC242" available from BASF, a compound represented by the aforementioned formula (A1))

S420: surfactant (product name "Surflon 5420" available from AGC Seimi Chemical Co., Ltd.)

209F: surfactant (product name "FTERGENT FTX-209F" available from Neos Company Limited)

Irg379: polymerization initiator (product name "IRGACURE379" available from BASF)

CPN: cyclopentanone available from ZEON CORPORATION

CPME: cyclopentyl methyl ether available from ZEON CORPORATION

COP: resin having an alicyclic structure (thermoplastic norbornene resin, product name "ZEONOR1420R" available from ZEON CORPORATION)

TAC: triacetylcellulose film (available from Konica Minolta, Inc.)

As clear from the results in Tables 4 and 5, the liquid crystal resin films of Reference Examples 1 to 6 were good films that had favorable orientation in a diagonal direction and a smaller amount of heterogeneous matters than that in Reference Comparative Example 1.

The invention claimed is:

1. A method for manufacturing a multilayer film comprising:
   a first long-length substrate; and
   an optically anisotropic layer that is formed directly on the first substrate and contains cured liquid-crystal molecules, wherein
   the first substrate has an orientation-controlling force caused by stretching and has a birefringence Δn of 0.000050 or more and has a phase difference Re in an in-plane direction of 30 nm or more,
   a slow axis of the first substrate is different from a lengthwise direction of the first substrate, and
   the cured liquid-crystal molecules of the optically anisotropic layer have homogeneous orientation regularity in substantially a same direction as a direction of the slow axis of the first substrate,
   the method comprising:
   a step (I) of feeding out a long-length first substrate in the lengthwise direction, the first substrate having an orientation-controlling force caused by stretching, a birefringence Δn of 0.000050 or more and a phase difference Re in an in-plane direction of 30 nm or more, wherein a slow axis of the first substrate is different from a lengthwise direction of the first substrate;
   a step (II) of directly applying onto a surface of the fed-out first substrate a liquid crystal composition containing a polymerizable liquid crystal compound to form a layer of the liquid crystal composition;
   a step (III) of giving orientation to the polymerizable liquid crystal compound in the layer of the liquid crystal composition; and
   a step (IV) of polymerizing the polymerizable liquid crystal compound to form cured liquid-crystal molecules.

2. The method for manufacturing the multilayer film according to claim 1, wherein an applying direction of the liquid crystal composition is different from an orientation direction of the polymerizable liquid crystal compound.

3. A method for manufacturing an optically anisotropic laminate, comprising:
   separating the optically anisotropic layer from the multilayer film manufactured by the method according to claim 1; and
   attaching the optically anisotropic layer to a second long-length substrate.

4. The method for manufacturing the multilayer film according to claim 1, wherein the slow axis of the first substrate and the lengthwise direction of the first substrate form an angle of 10° to 90°.

5. The method for manufacturing the multilayer film according to claim 4, wherein the slow axis of the first substrate and the lengthwise direction of the first substrate form an angle of 40° to 50°.

6. The method for manufacturing the multilayer film according to claim 1, wherein the first substrate is a film of a resin having a positive intrinsic birefringence.

7. The method for manufacturing the multilayer film according to claim 1, wherein the first substrate is a film of a resin containing an alicyclic structure-containing polymer or a film of cellulose ester.

8. The method for manufacturing the multilayer film according to claim 1, wherein the first substrate is a stretched film obtained by widthwise stretching or diagonal stretching.

9. The method for manufacturing the multilayer film according to claim 1, wherein the optically anisotropic layer has inverse wavelength distribution.

10. The method for manufacturing the multilayer film according to claim 1, wherein the optically anisotropic layer is a $\lambda/4$ wave plate.

11. The method for manufacturing the multilayer film according to claim 1, wherein the optically anisotropic layer is a $\lambda/2$ wave plate.

12. The method for manufacturing the multilayer film according to claim 1, wherein the optically anisotropic layer has a thickness of 5 μm or less.

13. The method for manufacturing the multilayer film according to claim 1, wherein the first substrate has a birefringence Δn of from 0.000050 to 0.007500.

14. The method for manufacturing a circular polarizing plate, comprising:
    separating the optically anisotropic layer from the multilayer film manufactured by the method according to claim 1, and
    attaching an optically anisotropic layer to a long-length linear polarizer by a roll-to-roll process.

15. The method for manufacturing an organic electroluminescent display device comprising a circular polarizing plate, the method comprising manufacturing the circular polarizing plate by the method according to claim 14.

\* \* \* \* \*